(12) United States Patent
Yamazaki

(10) Patent No.: US 7,566,001 B2
(45) Date of Patent: Jul. 28, 2009

(54) IC CARD

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 32 days.

(21) Appl. No.: 10/920,352

(22) Filed: Aug. 18, 2004

(65) Prior Publication Data

US 2005/0045729 A1    Mar. 3, 2005

(30) Foreign Application Priority Data

Aug. 29, 2003    (JP) .............................. 2003-305805

(51) Int. Cl.
G06K 5/00    (2006.01)

(52) U.S. Cl. ...................... 235/380; 235/492

(58) Field of Classification Search ................. 235/375, 235/380, 492, 451; 257/635, 754, E31.04; 438/30, 462
See application file for complete search history.

(56) References Cited

U.S. PATENT DOCUMENTS

| | | |
|---|---|---|
| 4,238,848 A | 12/1980 | Yamaguchi et al. |
| 4,472,627 A | 9/1984 | Weinberger |
| 4,536,014 A | 8/1985 | Boutaleb et al. |
| 4,614,861 A | 9/1986 | Pavlov et al. |
| 4,667,087 A | 5/1987 | Quintana |
| 4,709,991 A | 12/1987 | Hoshikawa |
| 4,709,995 A | 12/1987 | Kuribayashi et al. |
| 4,754,418 A | 6/1988 | Hara |
| 4,876,441 A | 10/1989 | Hara et al. |
| 4,918,631 A | 4/1990 | Hara et al. |
| 4,931,623 A | 6/1990 | Nakamura et al. |
| 4,954,985 A | 9/1990 | Yamazaki |
| 5,148,301 A | 9/1992 | Sawatsubashi et al. |
| 5,412,192 A | 5/1995 | Hoss |
| 5,436,744 A | 7/1995 | Arledge et al. |
| 5,453,858 A | 9/1995 | Yamazaki |
| 5,473,145 A * | 12/1995 | Wallerstorfer et al. ...... 235/382 |
| 5,491,347 A * | 2/1996 | Allen et al. .................. 257/59 |

(Continued)

FOREIGN PATENT DOCUMENTS

CN    1302418    7/2001

(Continued)

OTHER PUBLICATIONS

Zhu.J et al., "Producing Technology of Polysilicon Micro Machine Film,", J. Sensor & Transducer Techno., 1993, No. 6, pp. 38-39/55.

(Continued)

*Primary Examiner*—Kumiko C Koyama
(74) *Attorney, Agent, or Firm*—Eric J. Robinson; Robinson Intellectual Property Law Office, P.C.

(57) ABSTRACT

The present invention includes an IC card that can realize high function without increasing the size of an IC chip, and that can realize cost reduction. The IC card has a first single crystal integrated circuit, a second integrated circuit, and a display device. The second integrated circuit and the display device are each formed from a thin film semiconductor film, over a plastic substrate, and the first single crystal integrated circuit is mounted on the plastic substrate so as to be electrically connected to the second integrated circuit.

53 Claims, 17 Drawing Sheets

U.S. PATENT DOCUMENTS

| | | | |
|---|---|---|---|
| 5,567,967 A | 10/1996 | Kusumoto | |
| 5,637,187 A * | 6/1997 | Takasu et al. | 438/30 |
| 5,643,826 A | 7/1997 | Ohtani et al. | |
| 5,656,511 A | 8/1997 | Shindo | |
| 5,693,956 A | 12/1997 | Shi et al. | |
| 5,701,167 A | 12/1997 | Yamazaki | |
| 5,703,755 A | 12/1997 | Flesher et al. | |
| 5,705,829 A | 1/1998 | Miyanaga et al. | |
| 5,737,272 A | 4/1998 | Uchiyama et al. | |
| 5,789,732 A | 8/1998 | McMahon et al. | |
| 5,818,252 A * | 10/1998 | Fullman et al. | 324/765 |
| 5,821,614 A * | 10/1998 | Hashimoto et al. | 257/679 |
| 5,834,071 A | 11/1998 | Lin | |
| 5,889,291 A | 3/1999 | Koyama et al. | |
| 5,894,151 A * | 4/1999 | Yamazaki et al. | 257/347 |
| 5,923,962 A | 7/1999 | Ohtani et al. | |
| 6,002,605 A | 12/1999 | Iwasaki et al. | |
| 6,012,636 A | 1/2000 | Smith | |
| 6,019,284 A | 2/2000 | Freeman et al. | |
| 6,027,958 A | 2/2000 | Vu et al. | |
| 6,028,926 A | 2/2000 | Henderson et al. | |
| 6,064,988 A | 5/2000 | Thomas | |
| 6,191,838 B1 | 2/2001 | Muramatsu | |
| 6,281,891 B1 * | 8/2001 | DaCosta et al. | 345/206 |
| 6,300,152 B1 | 10/2001 | Kim | |
| 6,360,954 B1 | 3/2002 | Barnardo | |
| 6,375,081 B1 * | 4/2002 | Hileman et al. | 235/487 |
| 6,391,747 B1 | 5/2002 | Okumura et al. | |
| 6,402,039 B1 | 6/2002 | Freeman et al. | |
| 6,414,441 B1 | 7/2002 | Fries et al. | |
| 6,456,353 B1 | 9/2002 | Chen | |
| 6,518,557 B1 | 2/2003 | Izumi et al. | |
| 6,519,021 B1 * | 2/2003 | Aruga | 349/152 |
| 6,616,035 B2 | 9/2003 | Ehrensvärd et al. | |
| 6,656,779 B1 * | 12/2003 | Kasahara | 438/166 |
| 6,850,292 B1 | 2/2005 | Murade | |
| 6,859,195 B2 | 2/2005 | Kodate | |
| 6,940,143 B2 * | 9/2005 | Hiroshima | 257/459 |
| 6,961,111 B1 | 11/2005 | Kuramasu | |
| 7,105,365 B2 | 9/2006 | Hiroki et al. | |
| 7,112,115 B1 | 9/2006 | Yamazaki et al. | |
| 7,158,031 B2 | 1/2007 | Tuttle | |
| 7,239,564 B2 | 7/2007 | Mutaguchi | |
| 2001/0000763 A1 | 5/2001 | Muramatsu | |
| 2001/0009342 A1 | 7/2001 | Furukawa et al. | |
| 2001/0022644 A1 | 9/2001 | Hinata | |
| 2002/0159010 A1 | 10/2002 | Maeda et al. | |
| 2002/0186341 A1 | 12/2002 | Yamamura et al. | |
| 2003/0012870 A1 | 1/2003 | Sakurada | |
| 2003/0024635 A1 | 2/2003 | Utsunomiya | |
| 2003/0067576 A1 | 4/2003 | Cho | |
| 2003/0089132 A1 | 5/2003 | Kusuda | |
| 2003/0090450 A1 | 5/2003 | Inada et al. | |
| 2004/0004434 A1 | 1/2004 | Nishi et al. | |
| 2004/0090829 A1 | 5/2004 | Miura et al. | |
| 2004/0108987 A1 | 6/2004 | Park et al. | |
| 2004/0128246 A1 | 7/2004 | Takayama et al. | |
| 2004/0129450 A1 | 7/2004 | Yamazaki | |
| 2005/0045729 A1 | 3/2005 | Yamazaki | |
| 2005/0051870 A1 | 3/2005 | Yamazaki et al. | |
| 2005/0106841 A1 | 5/2005 | I-Chang | |
| 2005/0139918 A1 | 6/2005 | Lee | |
| 2006/0097286 A1 | 5/2006 | Chung et al. | |

FOREIGN PATENT DOCUMENTS

| | | |
|---|---|---|
| EP | 0 073 603 | 3/1983 |
| EP | 0 291 259 | 11/1988 |
| JP | 56-014369 | 2/1981 |
| JP | 02-007105 | 2/1990 |
| JP | 07-130652 | 5/1995 |
| JP | 09051020 A * | 2/1997 |
| JP | 2001-142089 | 5/2001 |
| WO | WO 01/09954 | 2/2001 |
| WO | WO-2002/69251 | 9/2002 |
| WO | WO 03/030096 | 4/2003 |

OTHER PUBLICATIONS

Office Action (Application No. 200310123568.4) dated Nov. 24, 2006.

Office Action (Application No. 200310123568.4) dated May 25, 2007.

Office Action (Application No. 200310123564.6) dated May 25, 2007.

* cited by examiner power supply voltage    various signals various signals

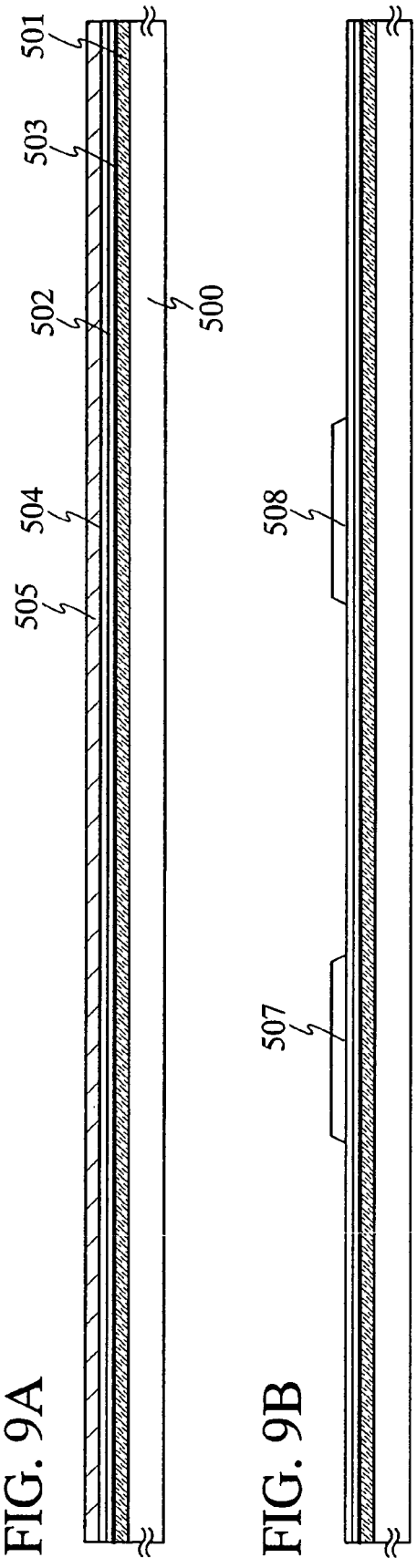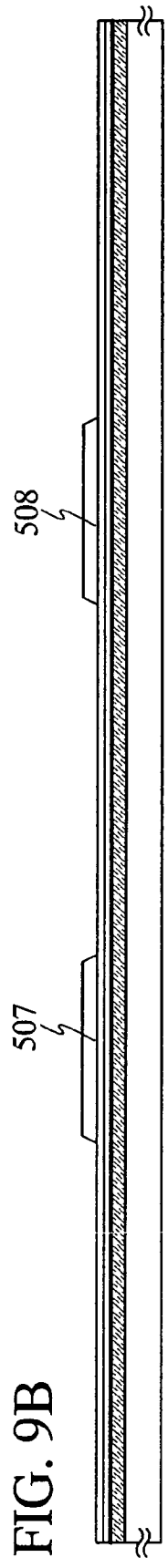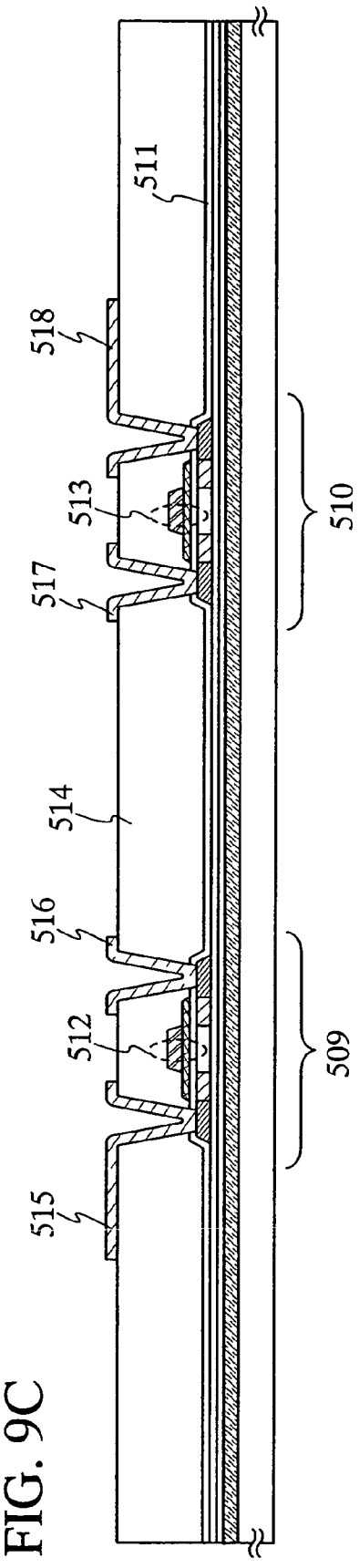
FIG. 9A
FIG. 9B
FIG. 9C

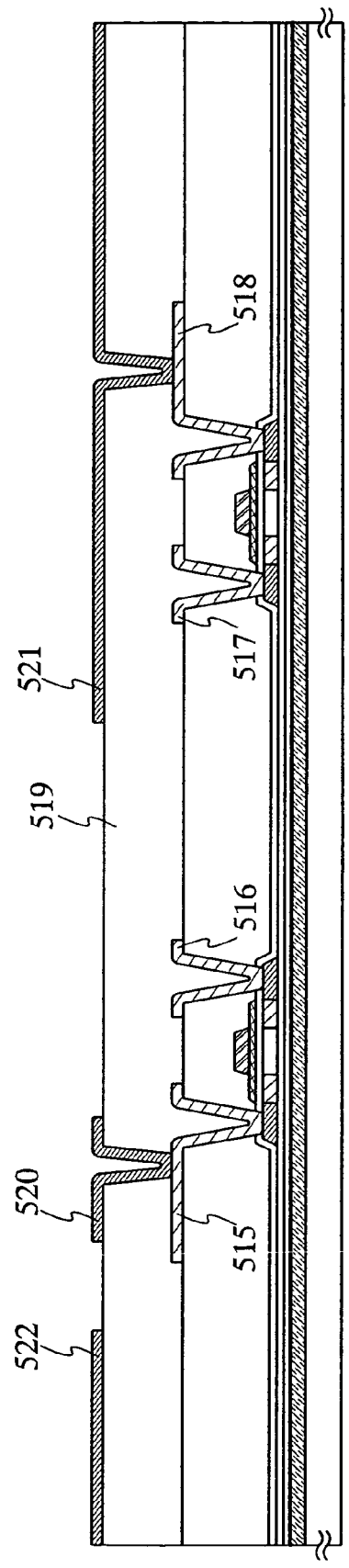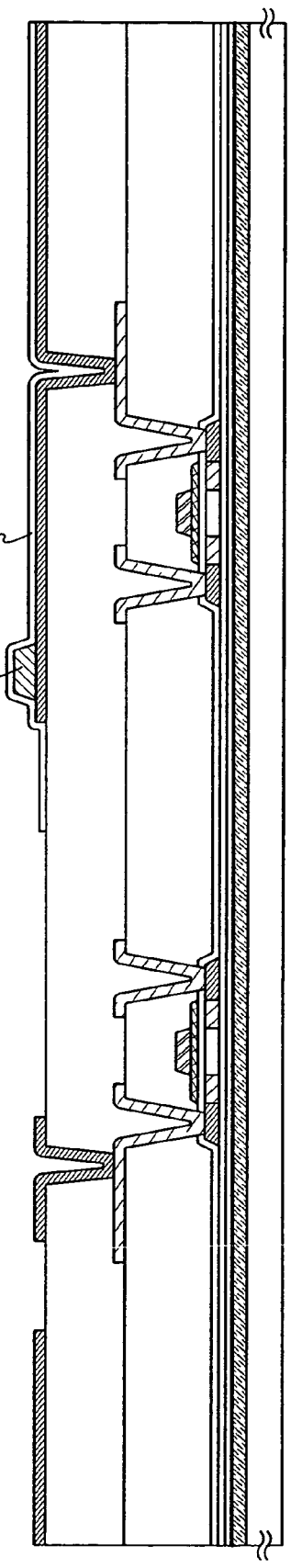
FIG. 10A
FIG. 10B

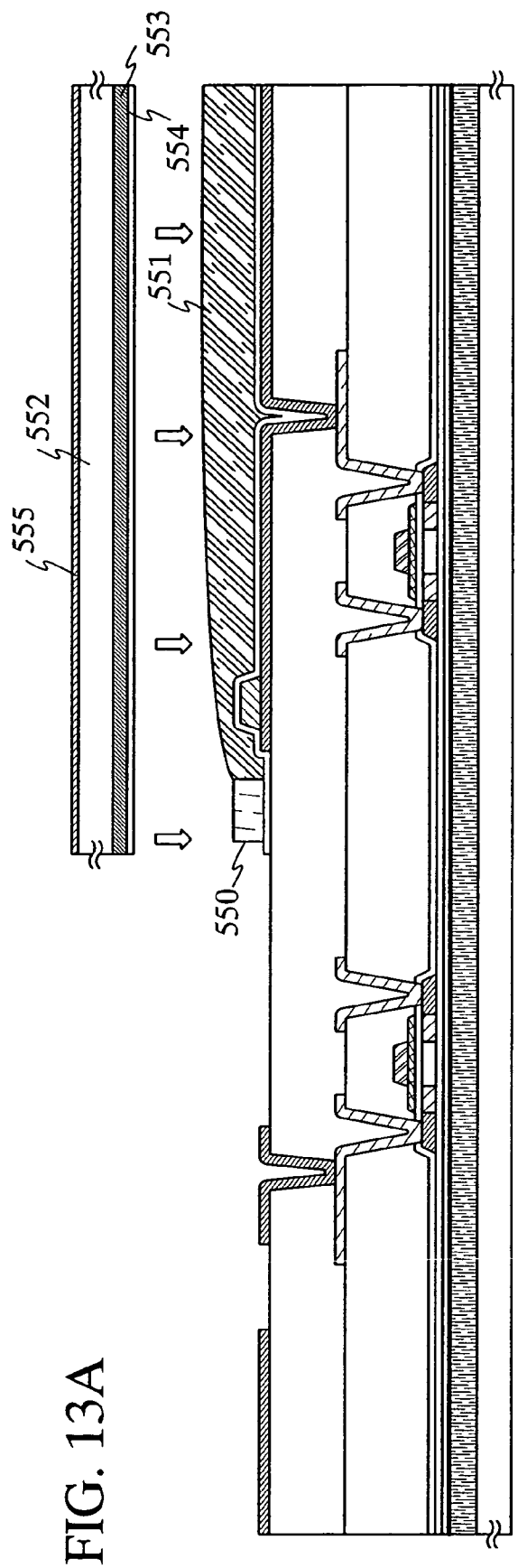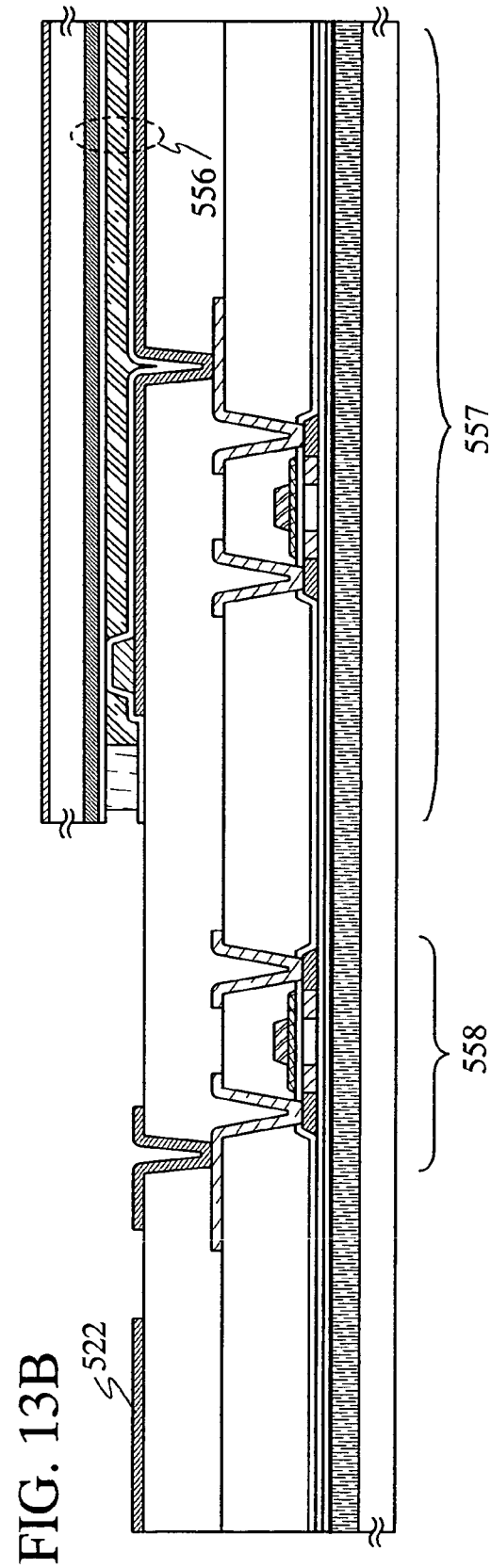

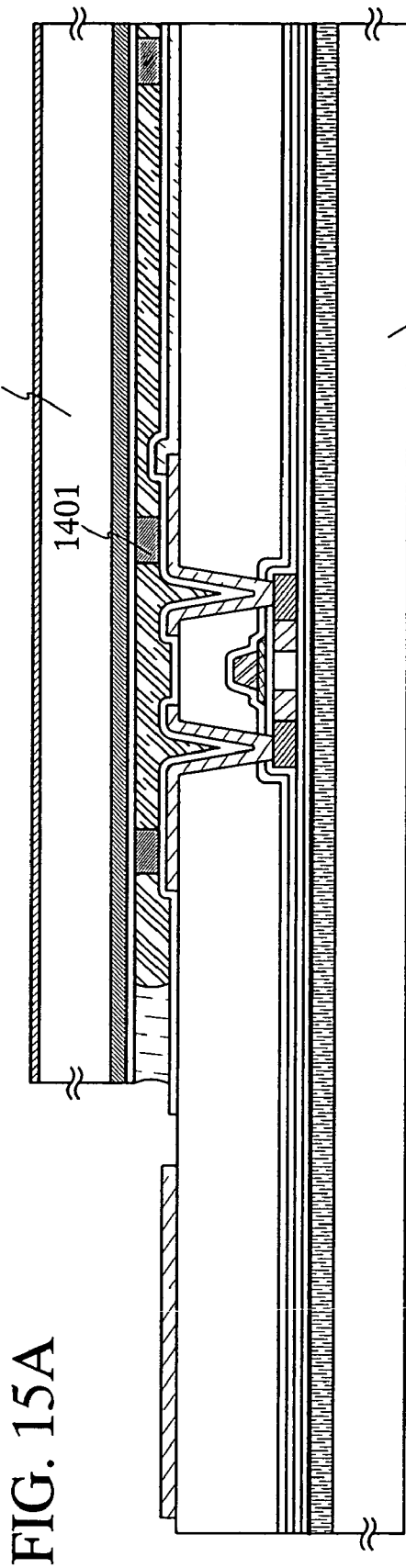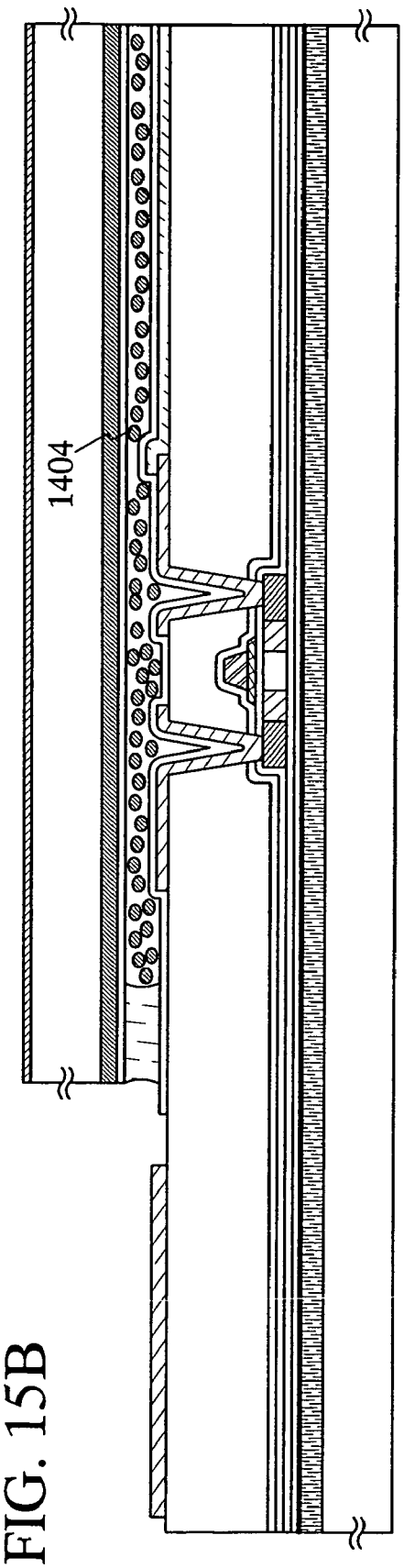
FIG. 15A
FIG. 15B

IC CARD

BACKGROUND OF THE INVENTION

1. Field of the Invention

The present invention relates to an IC card (which is also called a smart card) incorporating an integrated circuit such as a memory or a microprocessor (CPU), and a display device that can display an image.

2. Description of the Related Art

Several ten bytes of data only can be memorized in a magnetic card that can memorize data magnetically. However, an IC card (an electronic card) incorporating a semiconductor memory, normally, can memorize about 5 KB of data or more. The IC card can assure much more capacity than a magnetic card. Further, the IC card has merits that the IC card does not have a risk that data is read out by a physical means such as putting iron sand on the card, different from a magnetic card, and that data memorized in the IC card is not easily falsified.

It is noted that a category of a card typified by an electronic card includes an ID card to serve as an identification paper, a semi hard card having flexibility such as a plastic card, and the like.

In recent years, an IC card has a higher function by being provided with an integrated circuit such as a CPU as well as a memory. The application thereof is wide-ranging, for example, it is applied to an ATM card, a credit cart, a prepaid card, a patient's registration card, an identity card such as a student card or an employee ID card, a season ticket, a membership card, etc. As an example of the high function, an IC card for which a display device that can display simple characters and numbers is provided and for which a keyboard to input numbers is provided is described in Reference 1 (Reference 1: Japanese Examined Patent Publication No. H2-7105).

As described in Reference 1, a new use becomes possible by adding a new function to an IC card. Nowadays, electronic commerce, teleworking, remote medical care, remote education, computerized administrative services, automatic toll revenue from an expressway, image distribution service and the like using an IC card are to be put to a practical use and it is considered that an IC card will be used in a wider field in the future.

By the way, an integrated circuit used for an IC card is formed from a chip (referred to as IC chip) using a single crystal semiconductor substrate and is mounted on the IC card. The thickness of an IC card is generally about 0.76 mm, whereas the thickness of an IC chip is several hundred μm. Therefore, there is naturally a limitation on the size of an IC chip in holding the intensity for bending of an IC card to some extent. Accordingly, it is difficult to mount much more integrated circuits that are larger in a circuit scale or a memory capacity, on an IC chip having a limitation on its size, thereby preventing the integrated circuits from having higher functions.

Cost reduction of an IC card is also an important object to spread an IC card in a wider field.

As an IC card is used more widely, a misapplication of an IC card becomes a bigger problem measurably. A future issue is how securely identification is performed when an IC card is used. Printing a picture of a face on an IC card is one of measures for preventing the misapplication of the IC card. It is possible, by printing a picture of a face, that a third person can identify a person to be identified at a glance when the person uses his/her IC card, if such identification is not performed in an unattended terminal operation such as ATM. A misapplication can be prevented efficiently in the case where a security camera that can take a picture of a user's face at close range is not provided. However, in general, a picture of a face is transferred on an IC card by a printing method, and thus there is a pitfall that the picture of the face is easily changed by forgery.

SUMMARY OF THE INVENTION

It is an object of the present invention to provide an IC card that can realize high function without increasing the size of an IC chip, and that can realize cost reduction. Further, it is another object of the present invention to provide an IC card that can ensure security by preventing forgery such as changing a picture of a face, and that can display other images as well as a picture of a face.

According to the present invention, a second integrated circuit (thin film integrated circuit) formed from a thin semiconductor film is mounted on an IC card as well as an IC chip where a first integrated circuit is formed. Specifically, a thin film integrated circuit of about from 1 μm to 5 μm in total film thickness can be formed by using a thin semiconductor film of 500 nm or less in film thickness. And the thin film integrated circuit is transferred on a plastic substrate functioning as a support medium, and it is electrically connected to an IC chip similarly mounted on the plastic substrate.

Various methods as follows can be employed as a transfer method of a thin film integrated circuit: a method of providing a metal oxide film between a favorably heat-resisting substrate and a thin film integrated circuit, and weakening the metal oxide film by crystallization to separate the thin film integrated circuit from the favorable heat-resisting substrate and transfer the thin film integrated circuit onto a plastic substrate; a method of providing an amorphous silicon film containing hydrogen between a favorably heat-resisting substrate and a thin film integrated circuit and removing the amorphous silicon film by laser irradiation or etching to separate the thin film integrated circuit from the favorable heat-resisting substrate and transfer the thin film integrated circuit onto a plastic substrate; a method of mechanically removing a favorably heat-resisting substrate in which a thin film integrated circuit is formed or removing it by etching with a solution or a gas to separate the thin film integrated circuit from the favorable heat-resisting substrate and transfer the thin film integrated circuit onto a plastic substrate; and the like.

Note that an integrated circuit formed on an IC chip can be operated with higher frequency and has a smaller variation on characteristics of a semiconductor element than a thin film integrated circuit. Therefore, it is preferable that a radio frequency (RF) circuit in which an operation at high frequency is required or an analog circuit which is easy to be affected by a variation of characteristics of a semiconductor element is formed in an IC chip. A digital circuit that is less affected by a variation of characteristics of a semiconductor element than an analog circuit or a low operation frequency circuit that can operate favorably with a thin semiconductor element or the like is preferably mounted on an IC card as a thin film integrated circuit. When a memory having a larger capacity is required, a memory may be formed on an IC chip. A memory may be formed as a thin film integrated circuit if the capacity of a memory can be controlled. As mentioned above, the yield of the whole integrated circuit can be increased and cost can be reduced by forming individually a circuit to be mounted as an IC chip and a circuit to be mounted as a thin film integrated circuit depending on characteristics of the circuits. A higher function IC card can be obtained while downsizing an IC chip.

In the present invention, a display device thin enough to be fit in an IC card is mounted on an IC card. A semiconductor element used for the display device is formed together with a thin film integrated circuit and transferred onto a plastic substrate. A display element of the display device may be manufactured after transferring, but may be manufactured before transferring. In the case where a display element is manufactured after transferring, for example, in the case of a liquid crystal display device, a pixel electrode of a liquid crystal cell that is electrically connected to a TFT that is one of semiconductor elements, or an orientation film covering the pixel electrode is manufactured first and then the display element is transferred. After that, an opposite substrate that has been manufactured separately is attached thereto and a liquid crystal is injected thereinto to complete the display device.

Note that a liquid crystal display device, a light-emitting device in which a light-emitting element typified by an organic light-emitting element is provided for each pixel, a DMD (Digital Micromirror Device), an electronic display and the like can be used as the display device.

Moreover, a thin film integrated circuit that has been formed separately may be attached and laminated to increase a circuit scale or a memory capacity. A thin film integrated circuit is much thinner than an IC chip formed by using a semiconductor substrate, and thus, the mechanical intensity of an IC card can be maintained to some extent even when plural thin film integrated circuits are laminated. A connection between the laminated thin film integrated circuits can be made by using a known connection method such as a flip chip method, a TAB (Tape Automated Bonding) method, or a wire bonding method.

Note that a mode of an IC chip is not limited to a mode of mounting it directly as a bare chip, but a mode of transferring an IC chip onto an interposer to be packaged and transferring it, is also possible. As for the packaging, every known mode such as DIP (Dual In-line Package), QFP (Quad Flat Package), SOP (Small Outline Package) is possible as well as CSP (Chip Size Package) and MCP (Multi Chip Package).

In the present invention, because not only an IC chip but also a thin film integrated circuit of 5 µm thick in total, preferably about 2 µm, is mounted on an IC card, a circuit scale or a memory capacity of the whole integrated circuit can be increased and a higher function IC card can be obtained while downsizing an IC chip. The thickness of a display device can be set to about 0.5 mm, preferably, about 0.3 mm. Accordingly, it is possible to provide a display device for an IC card having a thickness of from 0.5 mm through 1.5 mm. A large scale integrated circuit is formed by combining a thin film integrated circuit and an IC chip that are each formed separately, and therefore, the yield can be more increased than the case of forming integrated circuits on one substrate simultaneously.

These and other objects, features and advantages of the present invention become more apparent upon reading of the following detailed description along with the accompanying drawings.

BRIEF DESCRIPTION OF THE DRAWINGS

In the accompanying drawings:

FIGS. 9A to 9C each show a method for manufacturing a semiconductor element of an IC card of the present invention;

FIGS. 10A and 10B each show a method for manufacturing a semiconductor element of an IC card of the present invention;

FIGS. 13A and 13B each show a method for manufacturing a semiconductor element of an IC card of the present invention;

FIGS. 15A and 15B are cross-sectional views of a liquid crystal display device;

DETAILED DESCRIPTION OF THE INVENTION

Embodiment modes of the present invention are described with the accompanying drawings.

Figure 1A:
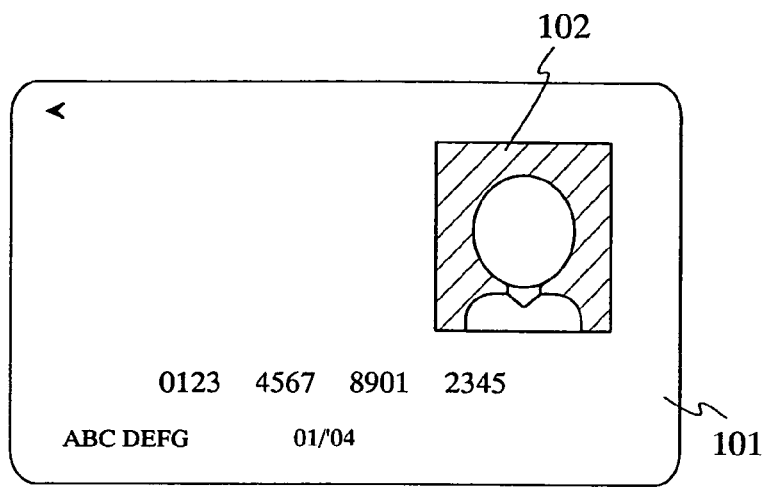
FIGS. 1A to 1C show an appearance and internal structures of an IC card of the present invention.

FIG. 1A shows one mode of an IC card according to the present invention. The IC card shown in FIG. 1A is a noncontact type card for sending and receiving data with a reader/writer of terminal equipment without being contacted therewith. Reference numeral 101 shows a card body. Reference numeral 102 corresponds to a pixel portion of a display device provided for the card body 101.

Figure 1B:
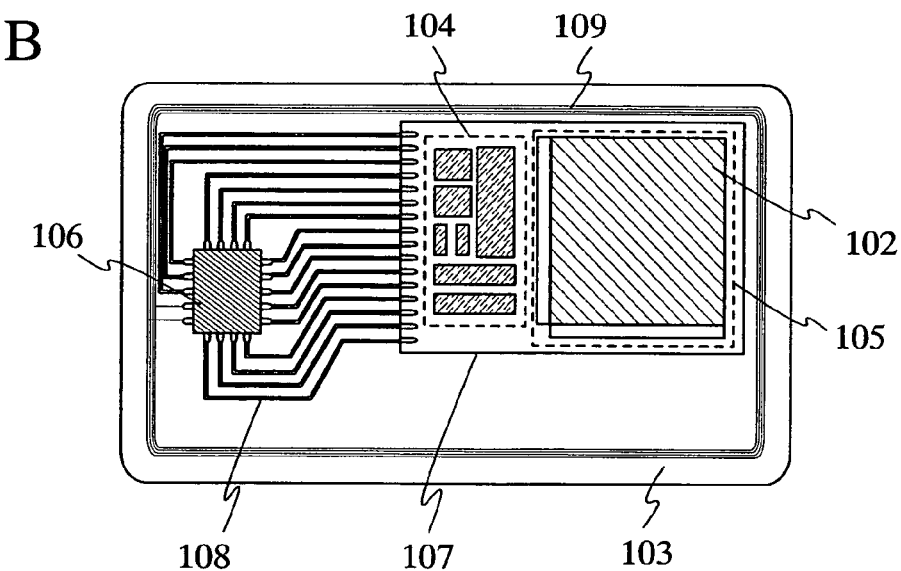

A structure of a card substrate 103 included in the card body 101 of FIG. 1A is shown in FIG. 1B. A thin film integrated circuit 104 formed from a thin semiconductor film and a display device 105 are attached to the card substrate 103. The thin film integrated circuit 104 and the display device 105 are both formed on substrates prepared separately and then, transferred onto the card substrate 103. In this specification, a portion that is formed by using a thin semiconductor film including the thin film integrated circuit 104 and the display device 105 and then transferred onto the card substrate 103 is referred to as a thin film portion 107.

Further, an IC chip 106 using a single crystal semiconductor substrate is mounted on the card substrate 103 and an integrated circuit is formed in the IC chip 106. A way of mounting of the IC chip 106 may be a known COG method, wire bonding method or TAB method without being limited in particular. Note that a first integrated circuit formed on an IC chip is referred to as a single crystal integrated circuit in this specification in order to distinguish it from a thin film integrated circuit. The IC chip 106 is electrically connected to the thin film portion 107 through a wiring 108 formed in the card substrate 103.

In addition, an antenna coil 109 connected electrically to the IC chip 106 is formed on the card substrate 103. Because sending and reception of data with a terminal device can be performed by the antenna coil 109 without contacting by using electromagnetic induction, a noncontact type IC card is less damaged by physical abrasion than a contact type IC card. Moreover, a noncontact type IC card is also used as a tag (a wireless tag) for conducting information management without contacting. In a noncontact type IC card, the amount of information that can be managed is larger drastically than a barcode that can read information without contacting similarly. Further, it is possible to make the distance from a terminal device that can read information longer in the case of using a noncontact type IC card than the case of using a barcode.

Note that FIG. 1B shows the example in which the antenna coil 109 is formed on the card substrate 103, but an antenna coil made separately may be mounted on the card substrate 103. For example, a material formed by winding a copper wire in coil like and pressing the copper wire with it sandwiched by two plastic films each having a thickness of about 100 μm can be used as an antenna coil. In addition, an antenna coil may be incorporated in a thin film integrated circuit.

In FIG. 1B, one antenna coil 109 is used for one IC card. However, a plurality of antenna coils 109 may be used as shown in FIG. 1C.

Figure 1C:
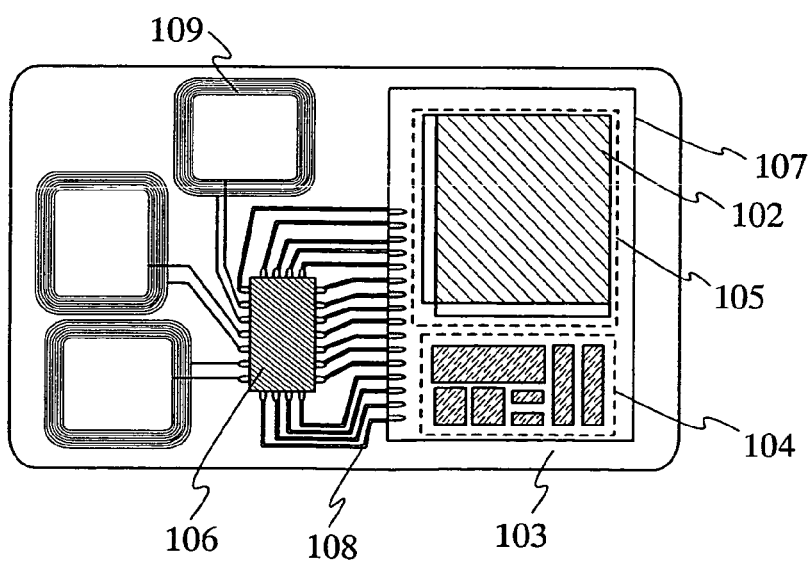

Note that a mode of an IC card mounting a display device is shown in FIGS. 1A to 1C, but the present invention is not limited to this structure. A display device is not necessarily provided for an IC card of the present invention. However, it is possible to display data of a photograph of a human face in a display device and to make replacing the photograph of a human face more difficult by providing the display device, as compared with the case of using the printing method. Moreover, other information than the photograph of a human face can be displayed and a higher function IC card can be obtained.

Various methods as follows can be employed as a transfer method of the thin film portion 107: a method of providing a metal oxide film between a favorably heat-resisting substrate and the thin film portion 107, and weakening the metal oxide film by crystallization to separate the thin film portion 107 from the favorable heat-resisting substrate and transfer the thin film portion 107 onto the card substrate 103; a method of providing an amorphous silicon film containing hydrogen between a favorably heat-resisting substrate and the thin film portion 107 and removing the amorphous silicon film by laser irradiation or etching to separate the thin film portion 107 from the favorable heat-resisting substrate and transfer the thin film portion 107 onto the card substrate 103; a method of mechanically removing a favorably heat-resisting substrate in which the thin film portion 107 is formed or removing it by etching with a solution or a gas to separate the thin film portion 107 from the favorable heat-resisting substrate and transfer the thin film portion 107 onto the card substrate 103; and the like.

A flexible plastic substrate can be used for the card substrate 103. ARTON manufactured by JSR corporation, which is made of norbomene resin including a polar group, can be used for the plastic substrate. Further, a plastic substrate such as polyethylene terephthalate (PET), polyether sulfone (PES), polyethylene naphthalate (PEN), polycarbonate (PC), nylon, polyetheretherketone (PEEK), polysulfone (PSF), polyetherimide (PEI), polyarylate (PAR), polybutylene telephthalate (PBT), or polyimide can be used.

A plastic substrate has a poor heat resistance to a temperature of the heat treatment conducted in the manufacturing process of a semiconductor element, and thus, it is difficult to use. However, according to the present invention, a glass substrate, a silicon wafer or the like having relatively high heat resistance up to a temperature in the manufacturing process including a heat treatment is used and a semiconductor element can be transferred onto a card substrate made of plastic, after the manufacturing process is finished. As a result, a thin film integrated circuit or a display device is formed on a plastic substrate that is thinner than a glass substrate or the like.

For example, the transferring using a metal oxide film is performed according to the following steps.

A first substrate is prepared first, which has a heat-resistance enough to withstand a heat treatment in manufacturing steps of a semiconductor element. After forming a metal film on the first substrate, a surface of the metal film is oxidized to form an ultrathin metal oxide film with the thickness of a few nanometers. Next, an insulating film and a semiconductor film are sequentially formed to be laminated on the metal oxide film. The insulating film may have a single layer structure or a laminated structure of multilayer. A silicon nitride, a silicon oxynitride, a silicon oxide and the like can be employed. By using the formed semiconductor film, a semiconductor element used for a thin film integrated circuit or a display device is manufactured.

After forming the semiconductor element, a second substrate is attached so that the semiconductor element is covered by the second substrate and sandwiched between the first and second substrates. It is to be noted that in the case of forming a display device concurrently with the thin film integrated circuit, the second substrate is attached before or after completing a display element. For example, in the case of attaching the second substrate before completing the display element, for example, when a liquid crystal cell is employed as the display element, a pixel electrode of the liquid crystal cell that is electrically connected to a thin film transistor (TFT) that is one of semiconductor elements, or an orientation film covering the pixel electrode is formed. Thereafter, the second substrate is attached before an opposite substrate in which an opposite electrode is formed, is attached.

Subsequently, in order to increase the rigidity of the first substrate, a third substrate is attached to the side opposite to the side of the first substrate on which the semiconductor element is formed. By making the first substrate more rigid than the second substrate, the first substrate can be separated smoothly with the semiconductor element less damaged. It is to be noted that the third substrate is not necessarily attached when the first substrate has rigidity high enough to withstand the separation from the semiconductor element.

Subsequently, the metal oxide film is crystallized by a heat treatment or the like so as to enhance brittleness of the metal oxide film and facilitate the separation of the first substrate from the semiconductor element. Then, the first substrate and the third substrate are separated simultaneously from the semiconductor element. It is to be noted that the heat treatment for crystallizing the metal oxide film may be carried out either before attaching the third substrate or before attaching the second substrate. Alternatively, the heat treatment conducted in the steps of manufacturing the semiconductor element may serve also as the step of crystallizing the metal oxide film.

The first substrate and the third substrate are separated together from the semiconductor element. Three portion are generated in the separation: a portion where the metal film is separated from the metal oxide film, a portion where the insulating film is separated from the metal oxide film, and a portion where the metal oxide film itself is separated into two sides. In either case, the semiconductor element is separated from the first substrate so as to be attached to the second substrate.

Subsequently, the first substrate is separated from the semiconductor element that has been attached to the second substrate, and then, the semiconductor element is attached to the card substrate with an adhesive agent or the like. Then, the second substrate is separated so as to transfer the semiconductor element onto the card substrate. In this transferring step, a wiring formed on the card substrate and a thin film integrated circuit formed from a semiconductor element may electrically connected to each other.

In the case of laminating a thin film integrated circuit, a thin film integrated circuit of the next layer is formed on another substrate prepared separately and transferred again so as to be stacked on the thin film integrated circuit that has been transferred earlier. By repeating transferring in this manner, thin film integrated circuits can be stacked on the card substrate. At this time, interlayer insulating films formed of resin or the like may be interposed between each thin film integrated circuit. Also, the adhesive agent which is used for transferring may substitute for the interlayer insulating films.

Note that a thin film integrated circuit and a display device may be transferred simultaneously or may be transferred individually.

Figure 2A:
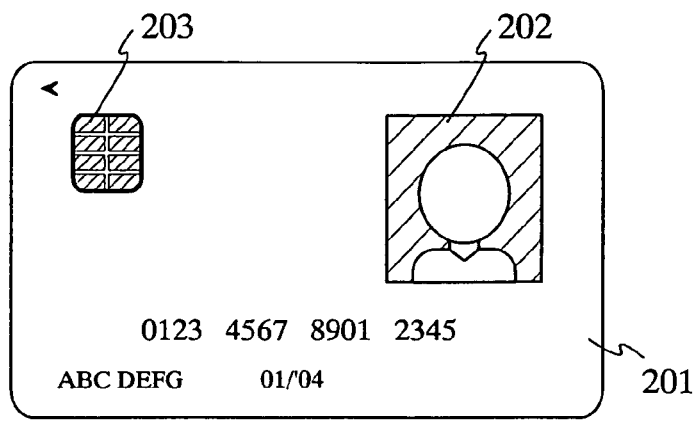
FIGS. 2A to 2E show an appearance and internal structures of an IC card of the present invention.

FIG. 2A shows one mode of an IC card according to the present invention. The IC card shown in FIG. 2A is a contact type card for sending and receiving data by electrically connecting a connection terminal provided for the IC card to a reader/writer of a terminal device.

Reference numeral 201 denotes a card body. Reference numeral 202 corresponds to a pixel portion of a display device mounted on the card body 201. Reference numeral 203 corresponds to a connection terminal of a thin film integrated circuit also mounted on the card body 201. The connection terminal 203 is a terminal for sending and receiving data between the terminal device and the IC card by being directly connected to a reader/writer provided for the terminal device.

Figure 2B:
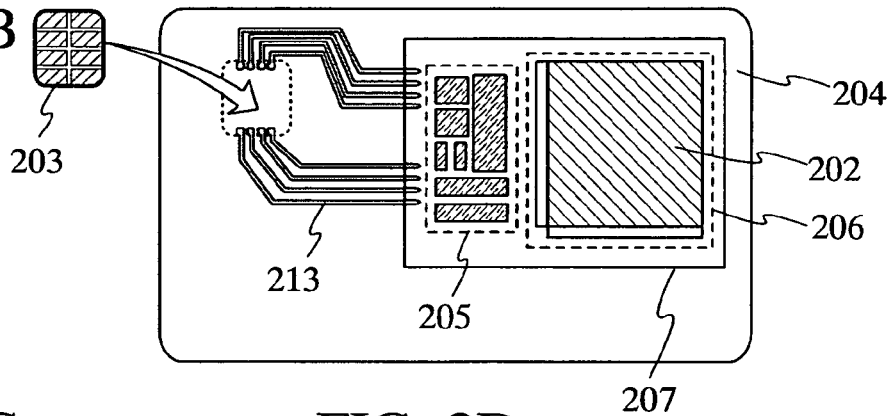

A structure of a card substrate 204 included in the card body 201 of FIG. 2A is shown in FIG. 2B. A thin film integrated circuit 205 formed from a thin semiconductor film and a display device 206 are attached to the card substrate 204 as in FIG. 1B. The thin film integrated circuit 205 and the display device 206 are both formed on substrates prepared separately and then, transferred onto the card substrate 204. In this specification, the thin film integrated circuit 205 and the display device 206 correspond to a thin film portion 207. A transfer method of the thin film portion 207 is similar to the case of FIG. 1A to 1C.

Figure 2C:
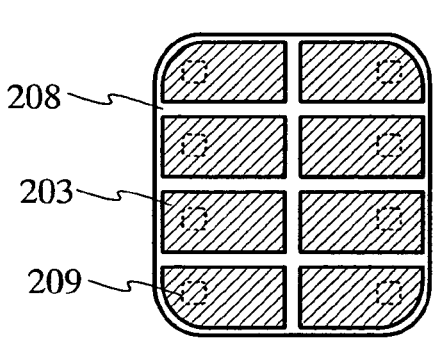
Figure 2D:
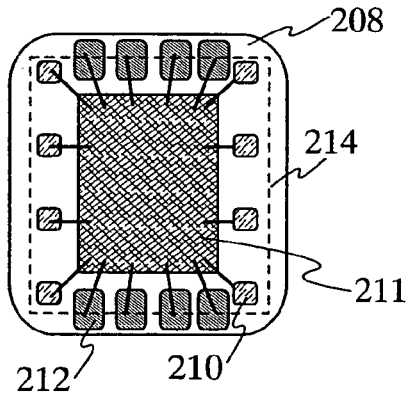

FIG. 2C shows an enlarged view of the connection terminal 203 shown in FIGS. 2A and 2B. FIG. 2D shows an enlarged view of a backside of FIG. 2C and it shows the printed wiring board 208 in which the connection terminal 203 is formed. The connection terminal 203 is formed on the printed wiring board 208 and is electrically connected to a terminal 210 that is formed on the backside of the printed wiring board 208 through a contact hole 209 formed in the printed wiring board 208. FIG. 2C shows an example that eight connection terminals 203 are provided, but the number of terminals is not limited thereto, naturally.

An IC chip 211 where a single crystal integrated circuit is formed, is provided on the backside of the face where the connection terminal 203 is formed, in the printed wiring board 208. The IC chip 211 is electrically connected to the terminal 210. Further, a terminal 212 for electrically connecting the IC chip 211 to the thin film integrated circuit is formed on the backside of the face where the connection terminal 203 is formed, in the printed wiring board 208.

FIG. 2D shows a mode of connecting the IC chip 211 to the terminals 210 and 212 by a wire bonding method, but the present invention is not limited to this. A flip chip method using a solder ball or other methods may be employed for the connection in addition to a wire bonding method.

The terminal 212 can be connected to a wiring 213 formed in the card substrate 204 by attaching the backside of the printed wiring board 208 to the card substrate 204 as shown in FIG. 2B. The IC chip 211 is electrically connected to the thin film portion 207 through the wiring 213.

Figure 2E:
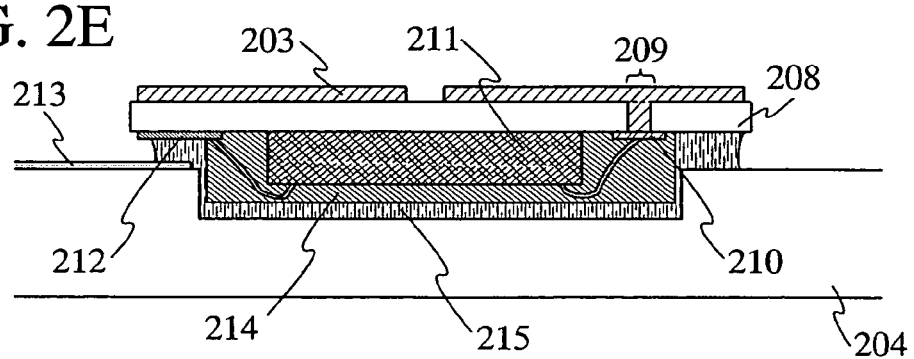

FIG, 2E shows a cross sectional view of a mode that the backside of the printed wiring board 208 is attached to the card substrate 204. As shown in FIG. 2E, the connection terminal 203 is electrically connected to the terminal 210 through the contact hole 209. The IC chip 211 is electrically connected to the terminals 210 and 212. A mold 214 including resin or the like is formed to cover the IC chip 211 and the terminal 210. The terminal 212 is not covered with the mold 214 wholly and at least a part thereof is made exposed from the mold 214. The terminal 212 is electrically connected to the wiring 213 by anisotropic conductive resin 215.

Because sending and reception of data with a terminal device can be performed by an electrical connection between the a reader/writer of the terminal device and the connection terminal in the case of a contact type IC card, electric power is supplied to an IC card more stably and is at less risk for communication failure than a noncontact type IC card.

Note that, in the present invention, an electric connection between the IC chip and the thin film integrated circuit is not limited to the modes shown in FIGS. 1A to 1C and, FIGS. 2A to 2E. The electrical connection may be performed by directly connecting a terminal of the IC chip and a terminal of the thin film integrated circuit with anisotropic conductive resin, a solder, or the like instead of using a wiring formed on the card substrate.

The connection between the thin film integrated circuit and the wiring formed on the card substrate may be performed by a wire bonding method, a flip chip method using a solder ball, or it may be performed by directly connecting with anisotropic conductive resin or a solder, or by other methods, in FIGS. 1A to 1C and, FIGS. 2A to 2E.

Figure 3A:
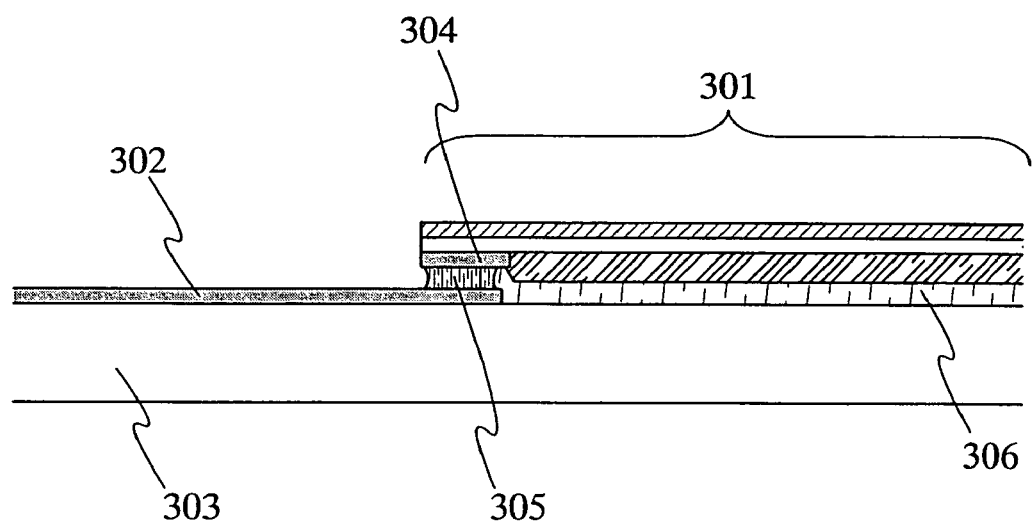
FIGS. 3A and 3B each show a structure of a connection portion of a wiring and a terminal in an IC card of the present invention.

A cross-sectional view in a connection portion between a thin film integrated circuit 301 and a wiring 302 formed on a card substrate 303 is shown in FIG. 3A. In FIG. 3A, the thin film integrated circuit 301 is attached to the card substrate 303 by an adhesive layer 306. A terminal 304 for outputting and inputting a signal or a power supply voltage in the thin film integrated circuit 301 is connected to the wiring 302 formed on the card substrate 303 via anisotropic conductive resin 305.

Figure 3B:
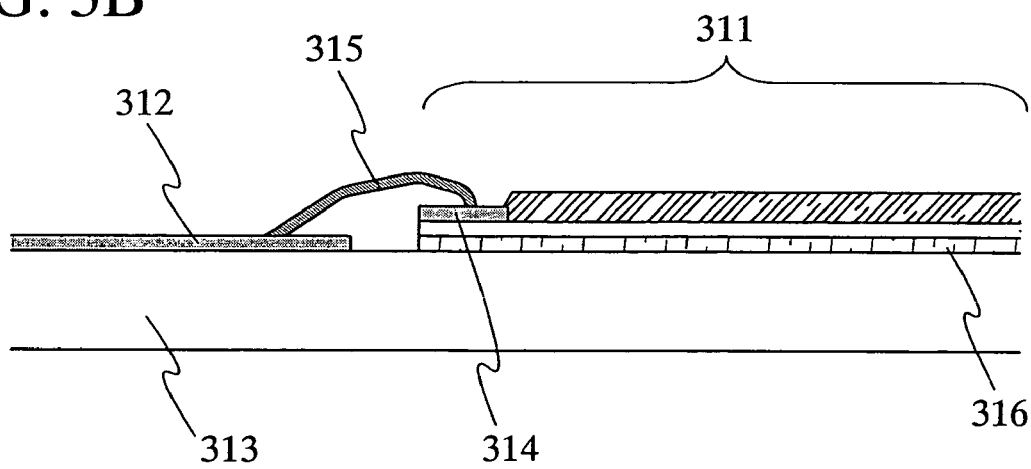

A cross-sectional view in a connection portion between a thin film integrated circuit 311 and a wiring 312 formed on a card substrate 313 is shown in FIG. 3B. In FIG. 3B, the thin film integrated circuit 311 is attached to the card substrate 313 by an adhesive layer 316. A terminal 314 for outputting and inputting a signal or a power supply voltage in the thin film integrated circuit 311 is connected to the wiring 312 formed on the card substrate 313 via a wire 315.

In FIG. 3A, the thin film integrated circuit 301 is attached so that the terminal 304 faces the card substrate 303 side. In FIG. 3B, the thin film integrated circuit 311 is attached so that the terminal 314 faces the opposite side of the card substrate 313. Therefore, when a display device is transferred onto the card substrate together with the thin film integrated circuit, since it is necessary that a side where a display element will be formed ultimately or a side where a display element is formed faces the opposite side of the card substrate, the direction of the terminal is determined depending on the direction of the display element. When a thin film integrated circuit and a display device are transferred separately, there is an advantage that a direction of a terminal needs not to be limited depending on the direction of the display element.

Figure 4:
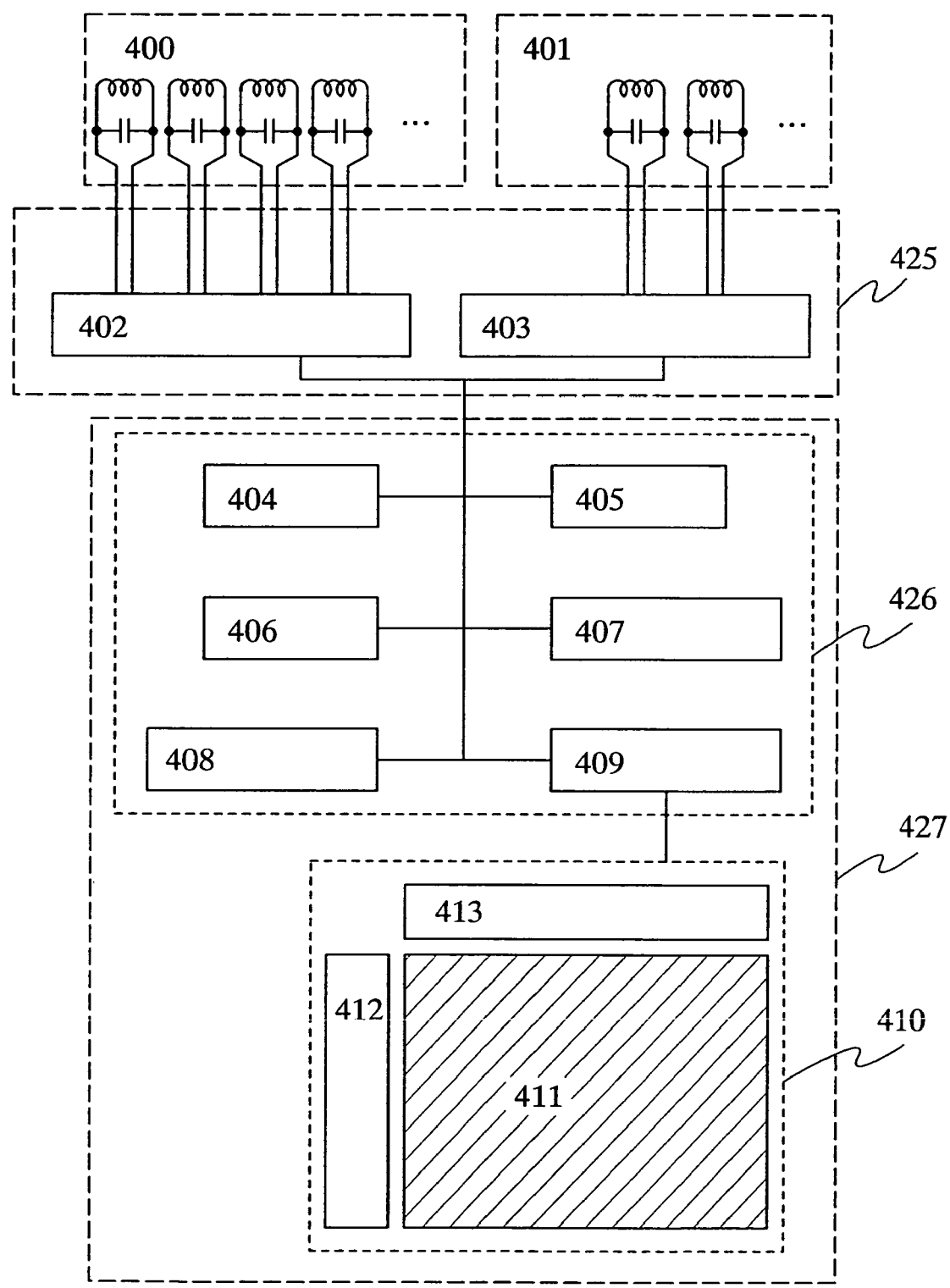
FIG. 4 is a block diagram showing a configuration of an IC card of the present invention.

One mode of a functional structure of an IC chip and a thin film integrated circuit in a noncontact type IC card is described hereinafter. FIG. 4 shows a block diagram of the noncontact type IC card.

Reference numeral 400 denotes an input antenna coil, 401 denotes an output antenna coil. 402 denotes an input interface, and 403 denotes an output interface. It is noted that the number of each antenna coil is not limited to the number shown in FIG. 4. AC power supply voltage or various signals inputted from a terminal device by the input antenna coil 400 are demodulated or made a direct current in the input interface 402, and then supplied to various circuits such as a CPU 404, a ROM 405, a RAM 406, an EEPROM 407, a coprocessor 408, and a controller 409. The signal that is processed or generated in each of the circuits is modulated in the output interface 403, and sent to the terminal device by the output antenna coil 401.

It should be noted that various circuits shown in FIG. 4 is mere one mode of the present invention, and thus, various circuits to be mounted on an IC card are not limited to the above described circuits.

All processes of the IC card are controlled by the CPU 404 in FIG. 4. Each program used in the CPU 404 is memorized in the ROM 405. The coprocessor 408 is a secondary coprocessor for helping the main CPU 404 to operate. The RAM 406 is used as an operation area during data processing as well as a buffer during a communication with a terminal device. The EEPROM 407 can memorize data inputted as a signal in a determined address.

Note that, image data such as a photograph of a face is memorized in the EEPROM 407 when the data can be rewritten, and in the ROM 405 when the data cannot be rewritten. Alternatively, another memory for memorizing image data may be provided.

A signal including image data is exposed to data processing in accordance with a specification of the display device 410 and supplied to the display device 410 as a video signal by the controller 409. In addition, an Hsync signal, a Vsync signal, a clock signal CLK, and an alternating voltage (AC Cont), etc. are generated based on respective signals or power supply voltage inputted from the input interface 402 and are supplied to the display device 410 by the controller 409.

A pixel portion 411 in which a display element is provided for each pixel, a scanning line driver circuit 412 for selecting a pixel provided for the pixel portion 411, and a signal line driver circuit 413 for supplying a video signal to the selected pixel are formed in the display device 410. Note that, reference numeral 427 denotes a thin film portion which includes the thin film integrated circuit 426 and the display device 410.

Figure 5A:
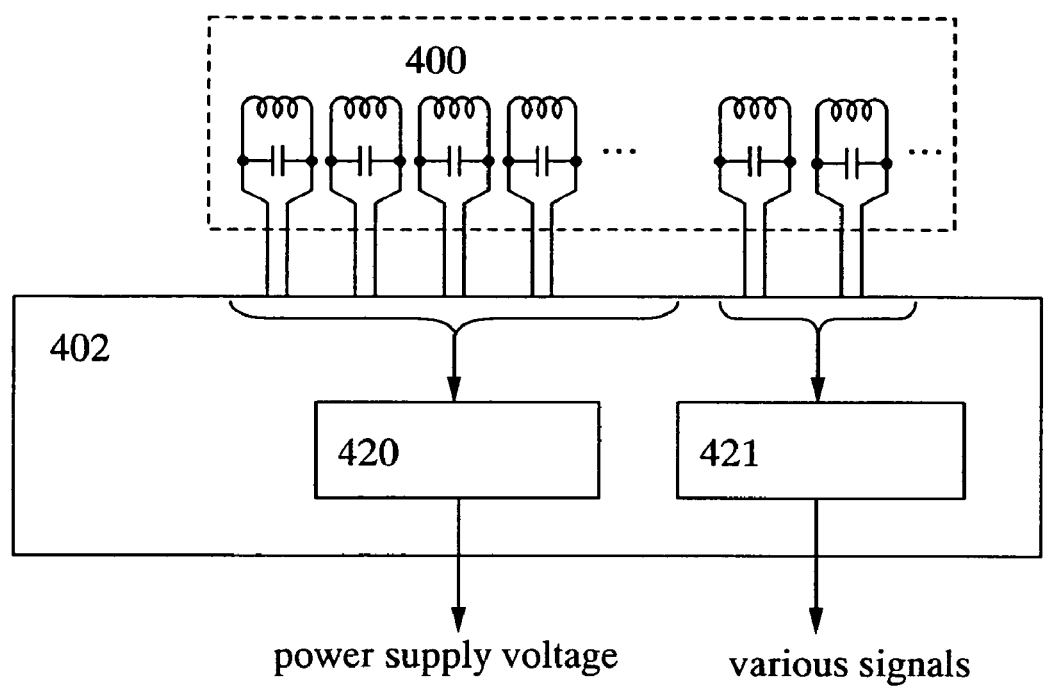
FIGS. 5A and 5B are block diagrams each showing a configuration of an IC card of the present invention.

FIG. 5A shows a more detailed structure of the input interface 402. A rectification circuit 420 and a demodulation circuit 421 are provided in the input interface 402 shown in FIG. 5A. AC power supply voltage inputted from the input antenna coil 400 is rectified in the rectification circuit 420 and supplied to each circuit as DC power supply voltage. Each of AC signals inputted from the input antenna coil 400 is demodulated in the demodulation circuit 421, and various signals waveform-shaped by demodulation are supplied to each circuit.

Figure 5B:
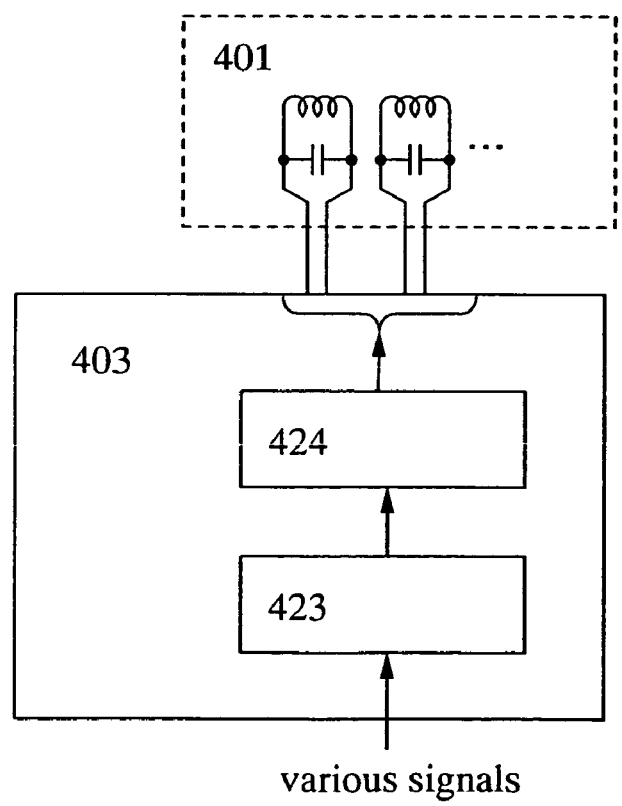

FIG. 5B shows a more detailed structure of the output interface 403. A modulation circuit 423 and an amplifier 424 are provided in the output interface 403 shown in FIG. 5B. Various signals that are inputted to the output interface 403 from each circuit are modulated in the modulation circuit 423, amplified or buffer-amplified in the amplifier 424, and then, sent to the terminal device from the output antenna coil 401.

In FIG. 4, an example of a noncontact type IC card using a coil antenna is shown. However, the noncontact type IC card is not limited thereto. A light emitting element, an optical sensor or the like may be used for sending and receiving data.

Note that an integrated circuit formed on an IC chip can be operated with higher frequency and has a smaller variation on characteristics of a semiconductor element than a thin film integrated circuit. Therefore, it is preferable that a radio frequency (RF) circuit in which an operation at high frequency is required or an analog circuit which is easy to be affected by a variation of characteristics of a semiconductor element is formed in an IC chip. A digital circuit that is less affected by a variation of characteristics of a semiconductor element than an analog circuit or a low operation frequency circuit that can operate favorably with a thin semiconductor element or the like is preferably mounted on an IC card as a thin film integrated circuit.

For example, in FIG. 5, the input interface 402 and the output interface 403 including analog circuits such as the rectification circuit 420, the demodulation circuit 421, and the modulation circuit 423 are formed in an IC chip 425. Various circuits such as the CPU 404, the ROM 405, the RAM 406, the EEPROM 407, the coprocessor 408, and the controller 409 are formed from the thin film integrated circuit 426.

When a memory having a larger capacity is required, either or all of the ROM 405, the RAM 406 and EEPROM 407 may be formed from the IC chip 425.

The structures of the IC chip 425, the thin film integrated circuit 426 and the display device 410 shown in FIG. 4 are only examples, and the present invention is not limited thereto. For example, a function such as GPS may be provided. The display device 410 may have a function of displaying an image, and it may be active type or passive type.

Figure 6:
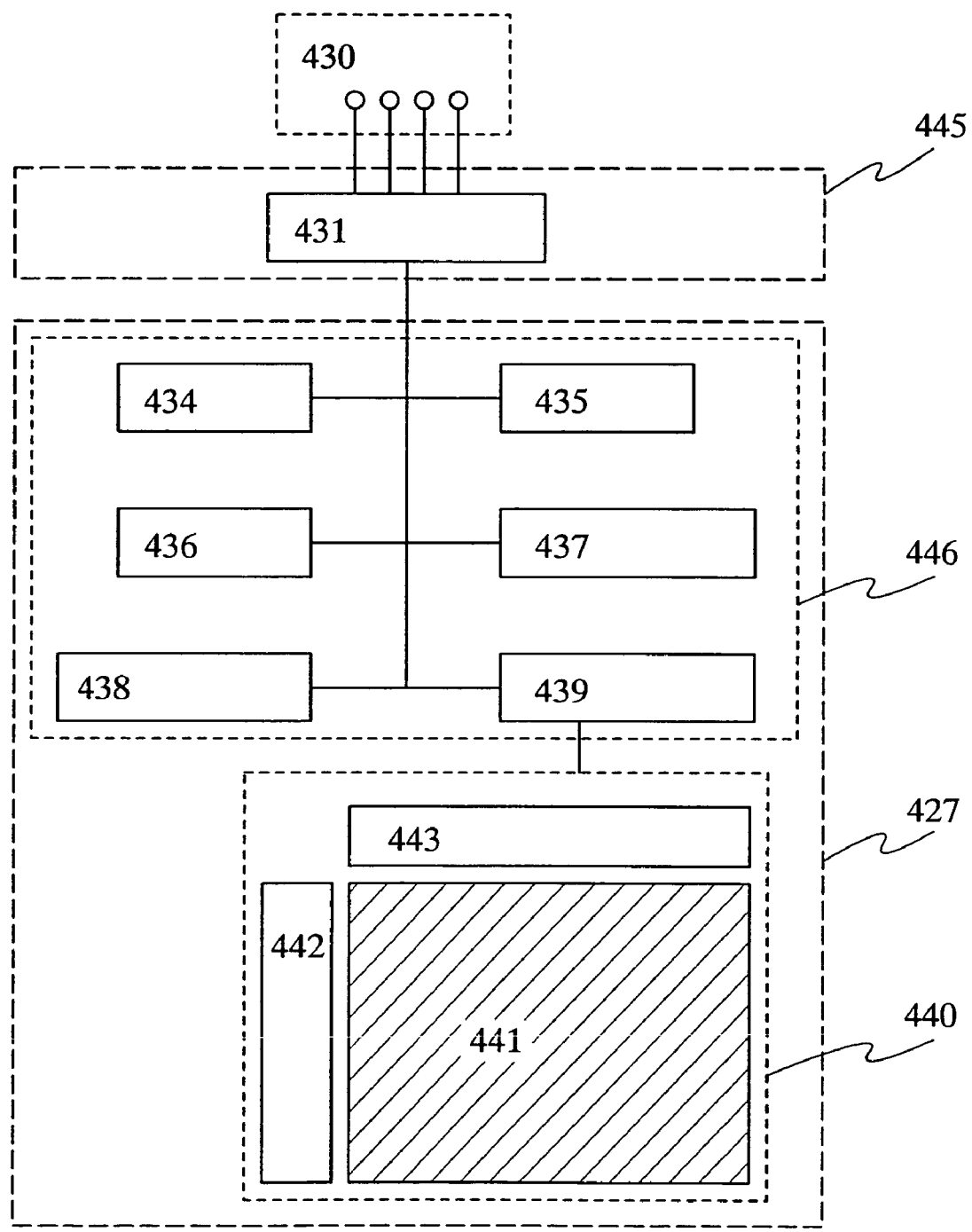
FIG. 6 is a block diagram showing a configuration of an IC card of the present invention.

Next, one mode of functional structures of an IC chip and a thin film integrated circuit in a contact type IC card is described. FIG. 6 shows a block diagram of the contact type IC card.

Reference numeral 430 denotes a connection terminal, and 431 denotes an interface. It is noted that the number of the connection terminals 430 is not limited to the number shown in FIG. 6. A power supply voltage or various signals inputted from the connection terminal 430 is buffer-amplified in the interface 431, and then supplied to various circuits such as a CPU 434, a ROM 435, a RAM 436, an EEPROM 437, a coprocessor 438, and a controller 439. Various signals that are processed or generated in the circuits are buffer-amplified in the interface 431, and sent to the terminal device. A pixel portion 441 where a display element is provided for each pixel, a scanning line driver circuit 442 for selecting a pixel provided in the pixel portion 441, and a signal line driver circuit 443 for supplying a video signal to the selected pixel are provided in the a display device 440.

It should be noted that various circuits shown in FIG. 6 is mere one mode of the present invention, and thus, various circuits to be mounted on an IC card are not limited to the above described circuits.

For example, in FIG. 6, the interface 431 is formed in an IC chip 445. Various circuits such as the CPU 434, the ROM 435, the RAM 436, the EEPROM 437, the coprocessor 438, and the controller 439 are formed from a thin film integrated circuit 446. When a memory having a larger capacity is required, either or all of the ROM 435, the RAM 436 and EEPROM 437 may be formed from the IC chip 445.

The structures of the IC chip 445, the thin film integrated circuit 446 and the display device 440 shown in FIG. 6 are only examples, and the present invention is not limited thereto. For example, a function such as GPS may be provided. The display device 440 may have a function of displaying an image, and it may be active type or passive type.

As mentioned above, the yield of the whole integrated circuit can be increased and cost can be reduced by forming individually a circuit to be mounted as an IC chip and a circuit to be mounted as a thin film integrated circuit depending on characteristics of the circuits. A higher function IC card can be obtained while downsizing an IC chip.

Figure 7:
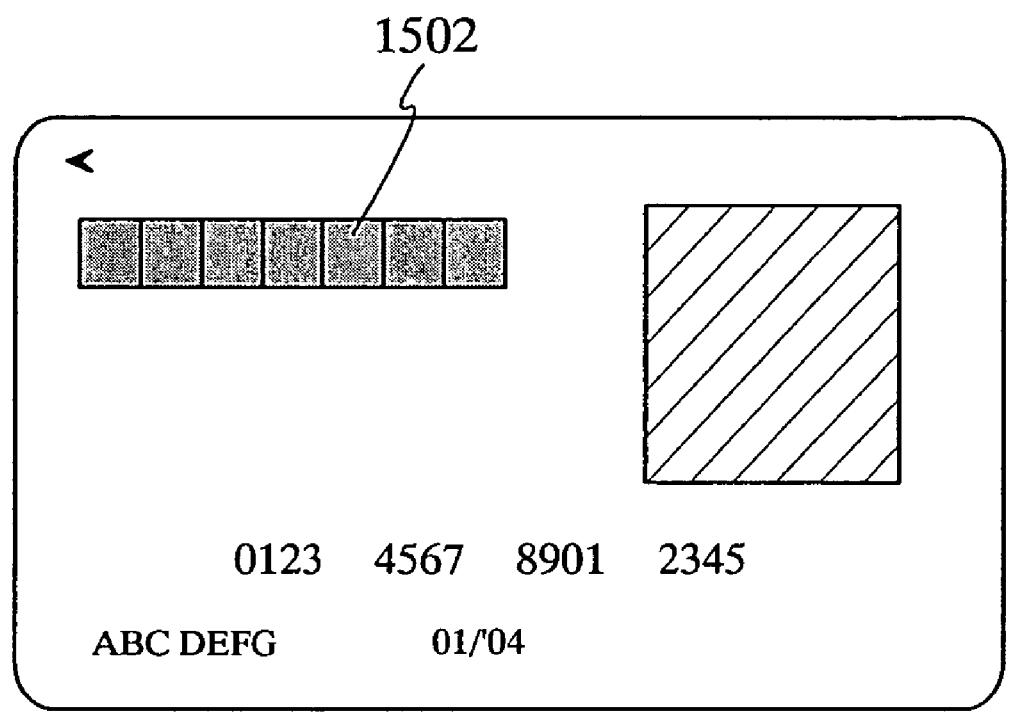
FIG. 7 is an appearance of an IC card equipped with a solar battery.

Further, FIG. 4 and FIG. 6 each show an example of supplying a power supply voltage from a reader/writer of a terminal device. However, the present invention is not limited thereto. For example, as shown in FIG. 7, a solar battery 1502 may be provided in an IC card. An ultrathin type battery such as a lithium battery may be incorporated.

Then, a shape of the card substrate is described.

Figure 8A:
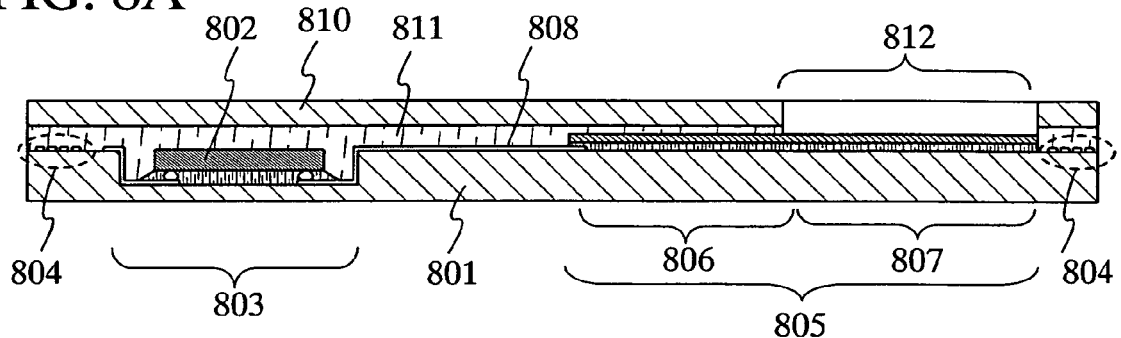
FIGS. 8A to 8D are cross-sectional views of an IC card of the present invention.

One mode of a cross-sectional structure of a noncontact type IC card is shown in FIG. 8A. Reference numeral 801 denotes a card substrate in FIG. 8A, and a concave portion 803 is formed. An IC chip 802 is mounted on the card substrate 801 in the concave portion 803. Reference numeral 805 denotes a thin film portion that includes a thin film integrated circuit 806 and a display device 807. The thin film integrated circuit 806 is electrically connected to the IC chip 802 by a wiring 808 formed on the card substrate 801.

A covering material 810 is attached to face the card substrate 801 with the IC chip 802, the thin film integrated circuit 806 and the antenna coil 804 therebetween by an adhesive agent 811. In FIG. 8A, an opening portion 812 is provided in a portion of the covering material 810 and the covering material 810 is attached so that the display device 807 is located in the opening portion 812. However, the opening portion 812 is not necessarily provided in the portion of the covering material 810 in the present invention. For instance, a material that can transmit light through a portion overlapping with the display device 807, may be used as the covering material 810.

Reference numeral 804 denotes an antenna coil. FIG. 8A shows an example of forming the antenna coil 804 on the card substrate 801, but an antenna coil formed separately may be mounted on the card substrate 801. Further, FIG. 8A shows an example of the antenna coil 804 provided outside the concave portion 803 of the card substrate 801, but the antenna coil 804 may be provided in the concave portion 803.

Figure 8B:
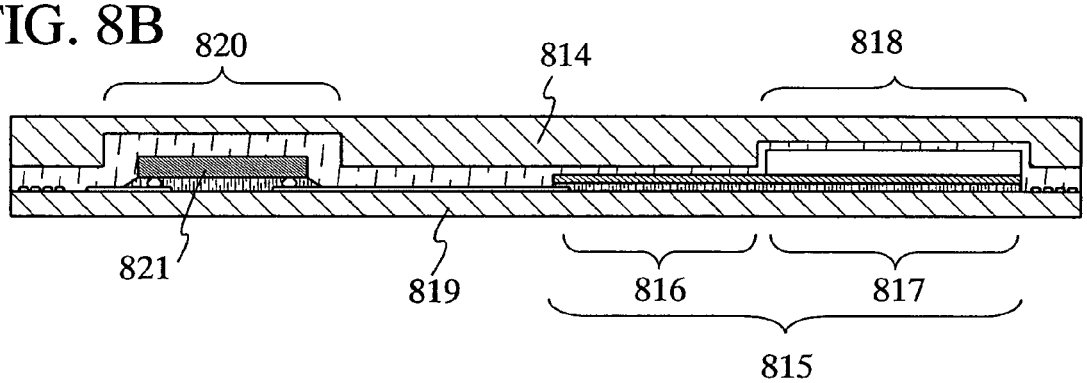

Note that the card substrate has the concave portion for providing an IC chip therein, in the IC card shown in FIG. 8A, but the concave portion may be provided in the covering material. FIG. 8B shows a cross-sectional view of a noncontact type IC card when a concave portion is provided in a covering material.

In FIG. 8B, an IC chip 821 and a thin film portion 815 are formed on a flat card substrate 819. The thin film portion 815 includes a thin film integrated circuit 816 and a display device 817. The card substrate 819 and a covering material 814 are attached to each other with the IC chip 821 and the thin film portion 815 therebetween. The covering material 814 includes concave portions 820 and 818 on the card substrate 819 side, and the concave portions 820 and 818 are overlapped with the IC chip 821 and the display device 817, respectively.

A material that can transmit light in the concave portion 818 is used as the covering material 814.

Figure 8C:
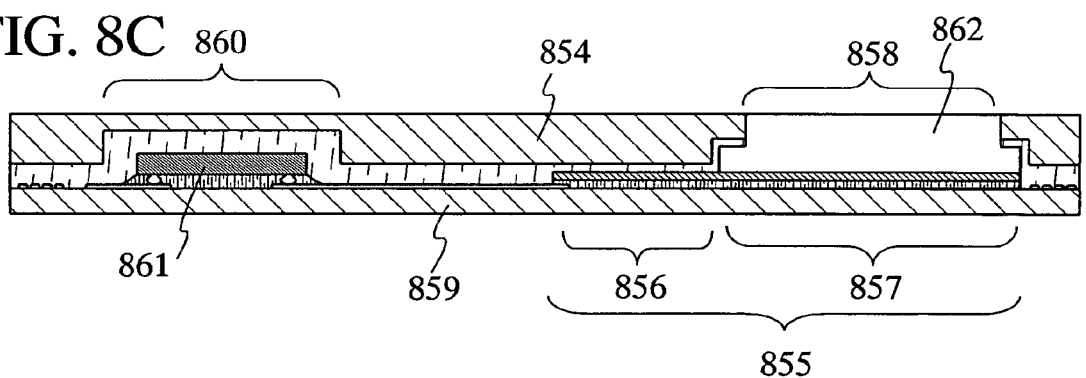

FIG. 8C shows a cross-sectional view of a noncontact type IC card when an opening portion is provided in a portion of a covering material overlapping with a display device.

In FIG. 8C, an IC chip 861 and a thin film portion 855 are formed on a flat card substrate 859. The thin film portion 855 includes a thin film integrated circuit 856 and a display device 857. The card substrate 859 and the covering material 854 are attached to each other with the IC chip 861 and the thin film portion 855 therebetween. The covering material 854 includes concave portions 860 and 862 and an opening portion 858 on the card substrate 859 side. The concave portion 860 is overlapped with the IC chip 861, and the concave portion 862 and the opening portion 858 are overlapped with the display device 857. A substrate covering a display element of the display device 857 has a concave portion and the concave portion is engaged and overlapped with the opening portion 858.

Figure 8D:
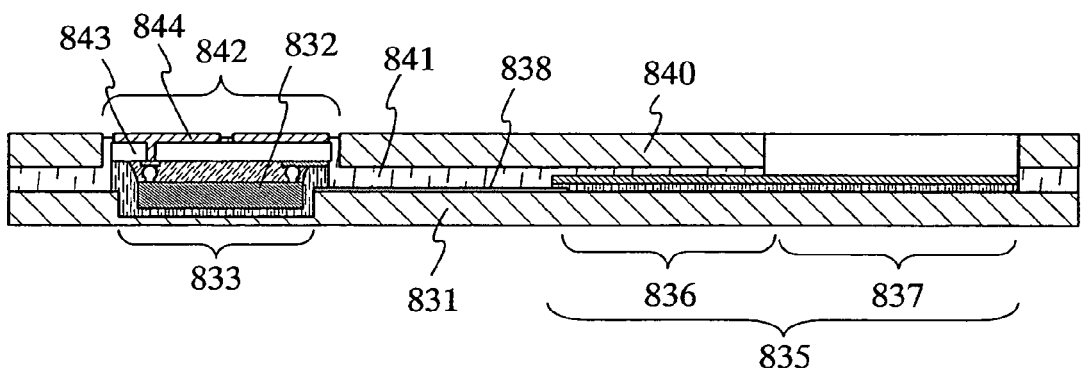

FIG. 8D shows one mode of a cross-sectional structure of a contact type IC card. In FIG. 8D, reference numeral 831 denotes a card substrate and a concave portion 833 is formed therein. An IC chip 832 is mounted on the card substrate 831 in the concave portion 833. Reference numeral 835 denotes a thin film portion that includes a thin film integrated circuit 836 and a display device 837. The thin film integrated circuit 836 and the IC chip 832 are electrically connected to each other by a wiring 838 formed on the card substrate 831.

A covering material 840 is attached to face the card substrate 831 by an adhesive agent 841 with the thin film integrated circuit 836 therebetween. In FIG. 8D, an opening portion 842 is provided in a portion of the covering material 840 and the covering material 840 is attached such that a printed wiring board 843 provided with the IC chip 832 is located in the opening portion 842. A connection terminal 844 is formed on the side opposite to the side where the IC chip 832 is formed. The connection terminal 844 is exposed in the opening portion 842 in a surface of the IC card.

FIGS. 8A to 8D each show the modes of forming the IC card by attaching the covering material to the card substrate where the IC chip or the thin film integrated circuit is formed, but the IC card of the present invention is not limited to the modes. For example, an IC card may be formed by sealing a card substrate with resin or the like without providing a covering material, or an IC card may be formed by sealing a card substrate with resin or the like with a covering material provided.

Note that in the case of sealing with resin, a material that can transmit light may be used for a portion overlapping with a display device, or the portion overlapping with a display device may be exposed without being sealed with resin. Note that a connection terminal is certainly exposed outside of an IC card in the case of sealing with resin.

EMBODIMENT 1

A method for manufacturing a thin film integrated circuit and a display device is described. Note that, in this embodiment, although a TFT is given as an example of a semiconductor element, the semiconductor element included in the thin film integrated circuit and the display device is not limited thereto, and various circuit elements can be used. For example, a memory element, a diode, a photoelectric transferring element, a resistor element, a coil, a capacitor element, an inductor and the like can be given as a representative example in addition to a TFT.

As shown in FIG. 9A, a metal film 501 is formed on a first substrate 500 by sputtering. The metal film 501 is made of tungsten to be from 10 nm to 200 nm, preferably from 50 nm to 75 nm in thickness. In this embodiment, the metal film 501 is formed directly on the first substrate 500. However, the first substrate 500 may be covered with an insulating film such as a silicon oxide, a silicon nitride, a silicon oxynitride and then, the metal film 501 may be formed thereover.

After the metal film 501 is formed, an oxide film 502 to serve as an insulating film is formed to be laminated without being exposed to the air. A silicon oxide film is formed to be from 150 nm to 300 nm in thickness as the oxide film 502. When the sputtering method is employed, an edge face of the first substrate 500 is also deposited. Therefore, it is preferable that the metal film 501 and the oxide film 502 deposited on the edge face are selectively removed by $O_2$ ashing or the like in order to prevent the oxide film 502 from remaining on the side of the first substrate 500 in a later step of separating.

When the oxide film 502 is formed, a pre-sputtering is performed as the preliminary step of the sputtering, in which plasma is generated while blocking off between a target and the substrate with a shutter. This pre-sputtering step is performed under the condition that the flow rates of Ar and $O_2$ are set to 10 sccm and 30 sccm, respectively, the temperature of the first substrate 500 is set to 270° C., and deposition power is set to 3 kW until the plasma reaches a stable state. Subsequently, an ultrathin metal oxide film 503 of about several nm (here, 3 nm) is formed between the metal film 501 and the oxide film 502 by the sputtering. The surface of the metal film 501 is oxidized to form the metal oxide film 503. Accordingly, the metal oxide film 503 is made of tungsten oxide in this embodiment.

In this embodiment, the metal oxide film 503 is formed by the sputtering. However, the present invention is not limited to the method. For example, the metal oxide film 503 may be formed by oxidizing deliberately the surface of the metal film 501 by plasma in the atmosphere of oxygen or oxygen added with inert gases such as Ar.

After forming the oxide film 502, a base film 504 is formed by PCVD. Here, a silicon oxynitride film is formed to have a thickness of approximately 100 nm as the base film 504. After forming the base film 504, a semiconductor film 505 is formed without being exposed to the air. The semiconductor film 505 is formed to have a thickness of from 25 nm to 100 nm, preferably, from 30 nm to 60 nm. The semiconductor film 505 may be an amorphous semiconductor, a microcrystalline semiconductor (semiamorphous semiconductor) or a polycrystalline semiconductor. Silicon germanium as well as silicon may be used for the semiconductor. In the case of using silicon germanium, the concentration thereof is preferably approximately from 0.01 to 4.5 atomic %.

The semiconductor film 505 is crystallized by a known technique. As known methods of crystallization, there are a thermo-crystallization method using an electrically heated oven, a laser crystallization method using laser light, and a lamp annealing crystallization method using an infrared ray. Alternatively, a crystallization method using a catalyst element may be employed according to the technique described in Japanese Patent Laid Open No.H07-130652.

In this embodiment, the semiconductor film 505 is crystallized by laser crystallization. Before the laser crystallization, thermal annealing is performed on the semiconductor film 505 for an hour at 500° C. to enhance the resistance of the semiconductor film to laser light. In this embodiment, brittleness of the metal oxide film 503 is enhanced by the heat treatment, and thus, the first substrate 500 is separated more easily later. The metal oxide film 503 is easily cracked by the crystallization in the grain boundary to enhance the brittleness thereof. In this embodiment, the crystallization of the metal oxide film 503 is preferably performed for from 0.5 to 5 hours at temperatures from 420° C. to 550° C.

It is possible to obtain crystals having a large grain size by irradiating a laser light of second to fourth harmonics with respect to a fundamental harmonic with a solid-state laser that is capable of continuously emitting. Typically, it is preferable to use second harmonic (532 nm) or third harmonic (355 nm) of an Nd:YVO$_4$ laser (fundamental harmonic: 1064 nm). Specifically, laser light emitted from a continuous wave type YVO$_4$ laser is converted to the harmonic with a non-linear optical element to obtain laser light with the output power of 10 W. Further, there is a method of obtaining a harmonic by using a non-linear optical element. Preferably, the laser light is formed so as to have a rectangular shape or an elliptical shape on an irradiated surface by using an optical system, and then irradiated to the semiconductor film 505. On this occasion, an energy density of approximately from 0.01 MW/cm$^2$ to 100 MW/cm$^2$ (preferably from 0.1 MW/cm$^2$ to 10 MW/cm$^2$) is necessary. The scanning speed thereof is set to approximately from 10 cm/s to 2000 cm/s to irradiate laser light.

The laser crystallization may be conducted by irradiating continuous wave laser light of a fundamental wave and continuous wave laser light of a harmonic, or irradiating continuous wave laser light of a fundamental wave and pulsed laser light of a harmonic.

Laser light may be irradiated in the inert gas atmosphere such as noble gas or nitride. According to this, the surface roughness of a semiconductor due to laser irradiation, and further, fluctuation on a threshold value due to the variations of interface state density can be suppressed.

The degree of crystallinity of the semiconductor film 505 is enhanced by the above described laser irradiation on the semiconductor film 505. The semiconductor film 505 that is a polycrystalline semiconductor film may in advance be formed by a sputtering method, a plasma CVD method, a thermal CVD method, or the like.

The semiconductor film is crystallized in this embodiment, but an amorphous silicon film may be used in the next process without performing the crystallization.

Then, as shown in FIG. 9B, the semiconductor film 505 is patterned to form island-like semiconductor films 507 and 508. Various semiconductor elements as typified by a TFT are formed using the island-like semiconductor films 507 and 508. In this embodiment, the island-like semiconductor films 507 and 508 are in contact with the base film 504, but an electrode, an insulating film, or the like may be formed between the base film 504 and the island-like semiconductor films 507 and 508, in some semiconductor elements. For example, in the case of a bottom gate TFT that is one of the semiconductor elements, a gate electrode and a gate insulating film are formed between the base film 504 and the island-like semiconductor films 507 and 508.

In this embodiment, top gate TFTs 509 and 510 are formed using the island-like semiconductor films 507 and 508 (FIG. 9C). Specifically, a gate insulating film 511 is formed so as to cover the island-like semiconductor films 507 and 508. Then, a conductive film is formed over the gate insulating film 511 and patterned to form gate electrodes 512 and 513. Next, impurities imparting n-type are added to the island-like semiconductor films 507 and 508 by using the gate electrodes 512 and 513 or resist that is formed and patterned as a mask to form a source region, a drain region, an LDD (Lightly Doped Drain) region and the like. Here, both TFTs 509 and 510 are n-type, but impurities imparting p-type are added in the case of using a p-type TFT.

According to the above-described process, TFTs 509 and 510 can be formed.

A first interlayer insulating film 514 is formed so as to cover the TFTs 509 and 510. Contact holes are provided for the gate insulating film 511 and the first interlayer insulating film 514, and then, wirings 515 to 518 connected to the TFTs 509 and 510 through the contact holes are formed to be in contact with the first interlayer insulating film 514.

A second interlayer insulating film 519 is formed over the first interlayer insulating film 514 so as to cover the wirings 515 to 518 (FIG. 10A). Contact holes are formed in the second interlayer insulating film 519, and wirings 520 and 521 to connect to the wirings 515 and 518 through the contact holes and a wiring 522 to serve as a terminal are formed to be in contact with the second interlayer insulating film 519. A portion of the wiring 521 serves also as a pixel electrode of a liquid crystal cell to be formed later. Note that an organic resin, an inorganic insulating film, an insulating film including Si—O bond and Si—CHx bond that are formed by using a siloxane material as a start material, or the like can be used as the first interlayer insulating film 514 and the second interlayer insulating film 519. The insulating film formed by using a siloxane material as a start material is effective for wire-bonding, since it has heat-resistance enough to resist a contact with a wiring made of a material having a high melting point, such as gold.

As shown in FIG. 10B, a spacer 523 is formed by using an insulating film. An orientation film 524 is formed to cover the wiring 521 and the spacer 523 and exposed to a rubbing treatment.

Figure 11A:
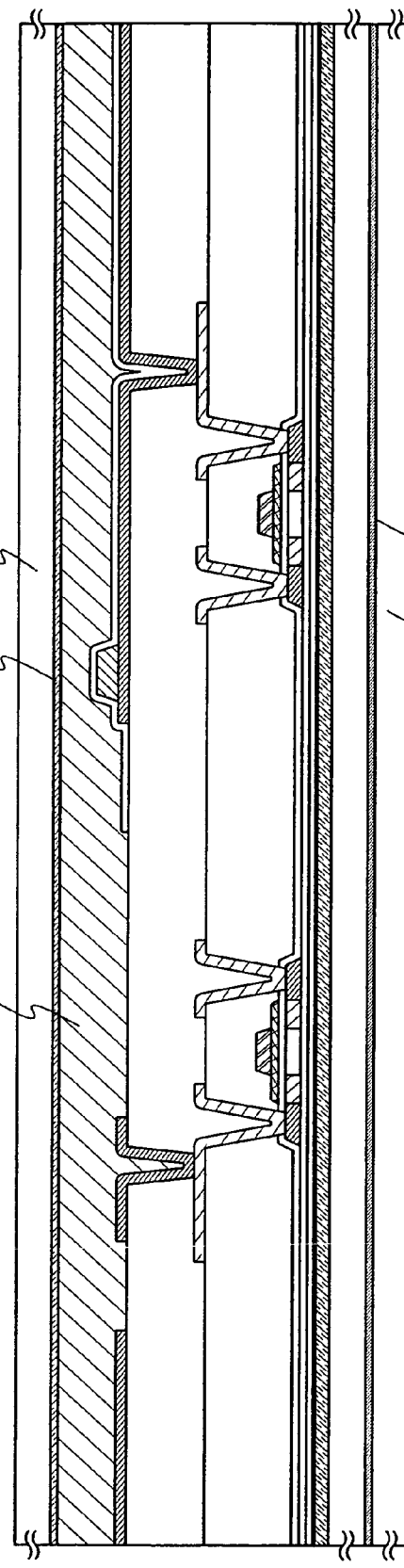
FIGS. 11A and 11B each show a method for manufacturing a semiconductor element of an IC card of the present invention.

A protective layer 531 is formed over the second interlayer insulating film 519 to cover the wirings 520 to 522, the spacer 523 and the orientation film 524 as shown in FIG. 11A. A material which can protect a thin film integrated circuit and a display device in bonding or separating a second substrate 533 later and which can be removed after separating the second substrate 533, is used as the protective layer 531. For example, the protective layer 531 can be formed by coating an epoxy, acrylate, or silicone resin that is soluble in water or alcohol, over the whole surface.

In this embodiment, water-soluble resin (manufactured by TOAGOSEI Co., Ltd.: VL-WSHL10) is spin-coated to have a thickness of 30 μm, and exposed for two minutes to be tentatively cured. After that, it is exposed its back to UV rays for 2.5 minutes, and then, exposed its surface for 10 minutes, namely 12.5 minutes to be fully cured in total. Consequently, the protective layer 531 is formed.

In the case of stacking a plurality of organic resin, there is a risk of melting partially the stacked organic resin depending on the used solvent during coating or baking, or increasing the adhesion thereof excessively. Therefore, in the case of using organic resins that are soluble in the same solvent for the second interlayer insulating film 519 and the protective layer 531, an inorganic insulating film (a $SiN_X$ film, a $SiN_XO_Y$ film, an AlNx film, or an $AlN_XO_Y$ film) is preferably formed to cover the second interlayer insulating film 519 so as to remove smoothly the protective layer 531 in a later step.

Then, a treatment is carried out in order to partially reduce the adhesion between the metal oxide film 503 and the oxide film 502 or the adhesion between the metal oxide film 503 and the metal film 501, thereby providing a trigger for separation. Specifically, a part of the inside or a part of the vicinity of the interface of the oxide film 503 is damaged by pressuring locally from outside along with the periphery of a region to be separated. In this embodiment, a hard needle such as a diamond pen may be perpendicularly be pressed on the periphery of the edge portion of the metal oxide film 503 and moved along the metal oxide film 503 with applying loading. Preferably, a scriber device can be used to move the pen with applying loading with press force ranging from 0.1 mm to 2 mm. As described above, a portion having reduced adhesion that can spark the start of separation is formed before separating, thereby preventing poor separation in a later separation step and improving the yield.

Next, a second substrate 533 is attached to the protective layer 531 with a two-sided tape 532, and a third substrate 535 is pasted over the first substrate 500 with a twp-sided tape 534. An adhesive agent may be used instead of the two-sided tape. For example, it is possible to reduce the load that is applied to the semiconductor element in separating the second substrate 533 by using an adhesive agent that is separated by UV light. The third substrate 535 is attached to prevent the destruction of the first substrate 500 in a later separation step. A substrate that has higher rigidity than that of the first substrate 500, for example, a quartz substrate or a semiconductor substrate is preferably to be used for the second substrate 533 and the third substrate 535.

Then, the metal film 501 is separated from the oxide film 502 by a physical means. The separation of the metal film 501 is started from the region in which the adhesion of the metal oxide film 503 to the metal film 501 or the oxide film 502 is partly reduced in the previous process.

Figure 11B:
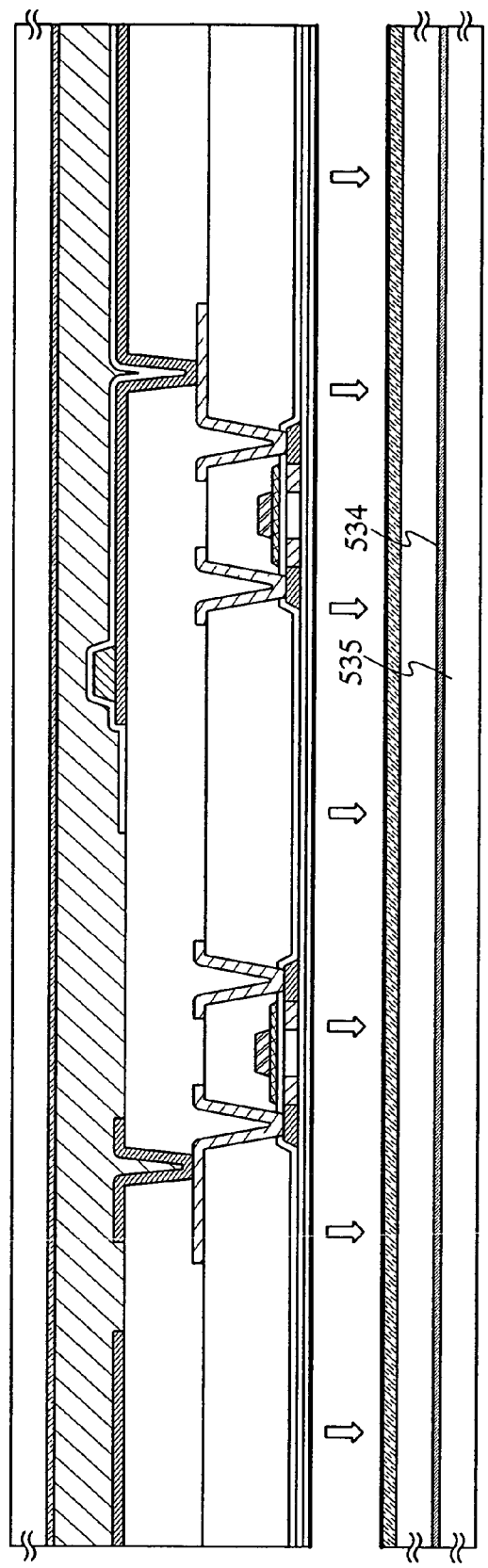

Three separating portions result from the separation, that is, a portion in which the metal film 501 is separated from metal oxide film 503, a portion in which the oxide film 502 is separated from the metal oxide film 503, and a portion in which the metal oxide film 503 is itself separated to two sides. Further, the second substrate 533 to which the semiconductor elements (here, TFTs 509 and 510) are attached is separated from the third substrate 535 to which the first substrate 500 and the metal film 501 are attached. The separation can be carried out with comparatively small force (for example, man's hand, air pressure of gas sprayed from a nozzle, ultrasonic waves, or the like). FIG. 11B shows a state after the separation step.

Figure 12A:
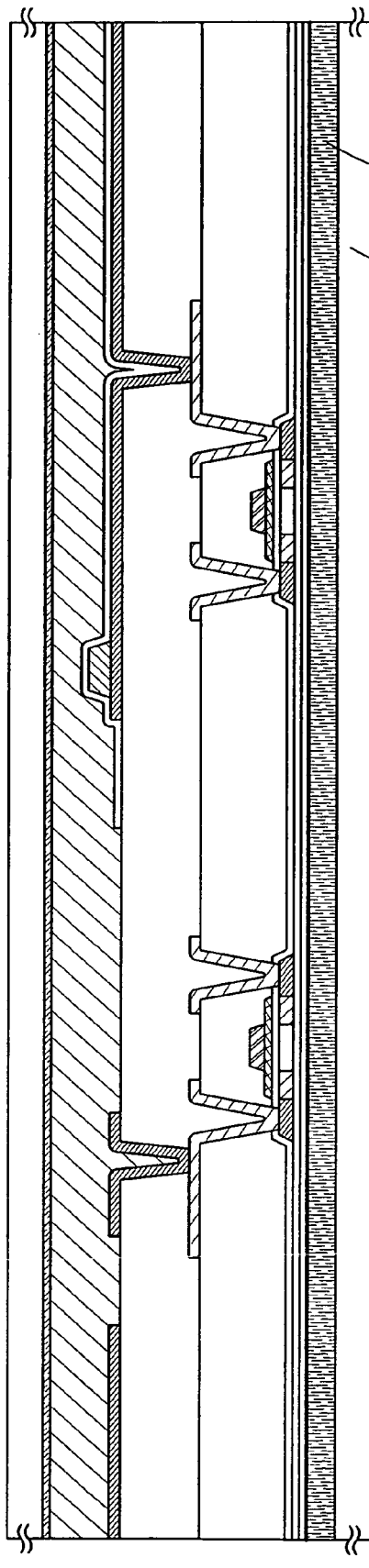
FIGS. 12A and 12B each show a method for manufacturing a semiconductor element of an IC card of the present invention.

A card substrate 540 is bonded to the oxide film 502 to a part of which the metal oxide film 503 is attached with an adhesive agent 539 (FIG. 12A). In the adhesive bonding, it is important to select a material for the adhesive agent 539 so that adhesion degree between the oxide film 502 and the card substrate 540 by the adhesive agent 539 is higher than that between the second substrate 533 and the protective layer 531 by the two-sided tape 532.

As the adhesive agent 539, various curing adhesive agents, for example, a reaction-curing adhesive agent, a thermal-curing adhesive agent, a photo-curing adhesive agent such as a UV curing adhesive agent, and an anaerobic adhesive agent can be used. The adhesive agent 539 preferably has high thermal conductivity by containing powder comprising silver, nickel, aluminum, or aluminum nitride, or filler.

Note that, in some cases, the adhesion with the card substrate 540 becomes worse when the metal oxide film 503 is left in a surface of the oxide film 502. Thus, the metal oxide film 503 may be removed completely, and then, the oxide film 502 is bonded to the card substrate to enhance the adhesion.

Figure 12B:
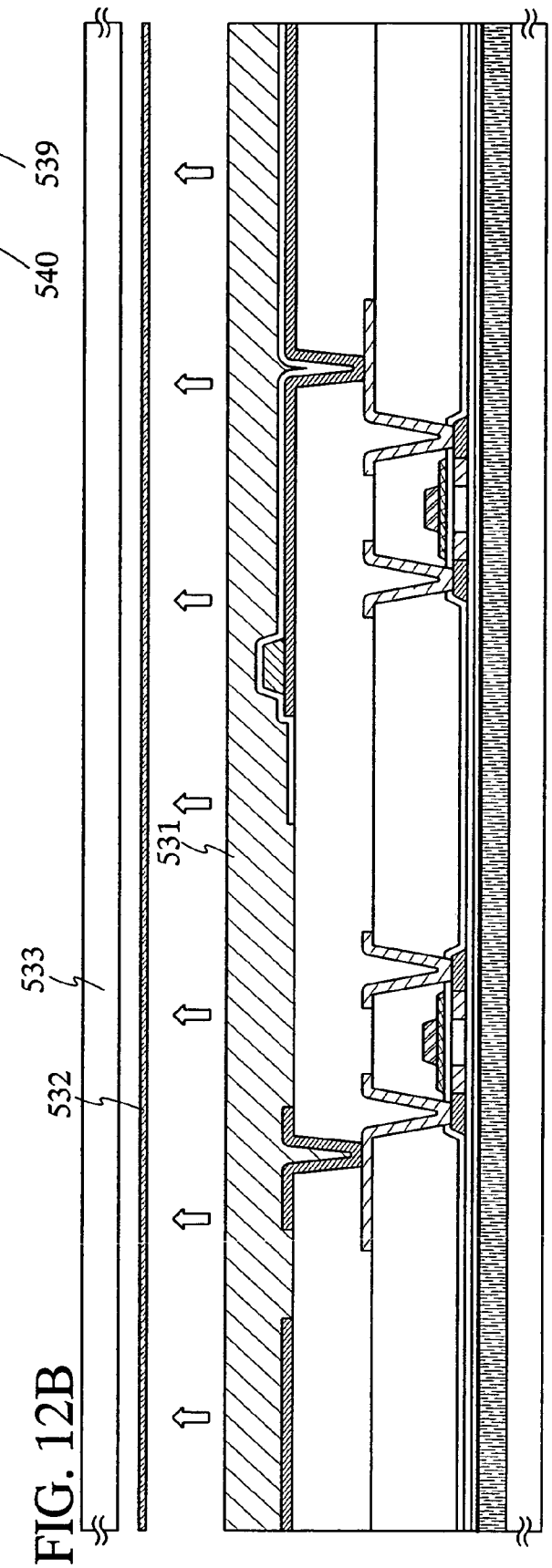

As shown in FIG. 12B, the two-sided tape 532 and the second substrate 533 are separated sequentially or simultaneously from the protective layer 531, and then the protective layer 531 is removed. Thus, the protective layer 531 is removed by water since the protective layer 531 is formed of the resin that is soluble in water. In the case where the left protective layer 531 causes deterioration, a left part of the protective layer 531 is preferably removed by carrying out a cleaning treatment or an $O_2$ plasma treatment on the surface after the removing step.

Then, a sealing material 550 is formed to seal a liquid crystal in. As shown in FIG. 13A, a liquid crystal 551 are dropped into the area surrounded by the sealing material 550. An opposite substrate 552 formed separately is attached by the sealing material 550. A filler may be mixed into the sealing material. The opposite substrate 552 has a thickness of about several hundred μm, and an opposite electrode 553 made of a transparent conductive film and an orientation film 554 exposed to a rubbing treatment are formed over the opposite substrate 552. Further, in addition to them, a color filter or a shielding film for preventing disclination may be provided for the opposite substrate. A polarization plate 555 is attached to the opposite side of the face where the opposite electrode 553 is formed in the opposite substrate 552.

FIG. 13B shows a mode after the opposite substrate 552 is attached. A portion in which the opposite electrode 553, the liquid crystal 551, and the wiring 521 are overlapped with one another corresponds to a liquid crystal cell 556. The liquid crystal cell 556 is completed, and thus, the display device 557 is also completed. In this embodiment, the opposite substrate 552 is not overlapped with the thin film integrated circuit 558. However, the opposite substrate 552 may be allowed to be overlapped with the thin film integrated circuit 558. In this case, resin having an insulating property may be filled between the opposite substrate and the thin film integrated circuit for the sake of enhancing the mechanical strength of the IC card.

A liquid crystal is sealed in by a dispenser method (a dripping method) in this embodiment. The present invention, however, is not limited to the method. A dip method (pumping up method) by which a liquid crystal is sealed in using capillary phenomenon after attaching the opposite substrate may be employed.

When the mode shown in FIG. 13B is completed, an IC card is completed by attaching a covering material or sealing with resin after an IC chip is mounted. Note that a connection with the IC chip can be performed by the wiring 522.

Materials used generally can be used for sealing the IC card, for example, a high-polymer material such as polyester, acrylic acid, polyvinyl acetate, propylene, chloroethylene, acrylonitrile-butadiene-styrene resin, or polyethylene terephthalate can be used. When the sealing is performed, a pixel portion of the display device is exposed. In the case of a contact-type IC card, a connection terminal as well as the pixel portion is exposed. The IC card having an appearance shown in FIG. 1A or FIG. 2A can be formed by the sealing.

Sealing with the sealant offers some advantages of enhancing mechanical strength of the IC card, radiating heat generated in the thin film integrated circuit and the display device, and shielding electromagnetic noises from circuits adjacent to the IC card.

A plastic substrate can be used for the card substrate 540, the opposite substrate 552 or the covering material. ARTON manufactured by JSR corporation, which is made of norbornene resin including a polar group, can be used for the plastic substrate. Polyethylene terephthalate (PET), polyether sulfone (PES), polyethylene naphthalate (PEN), polycarbonate (PC), nylon, polyetheretherketone (PEEK), polysulfone (PSF), polyetherimide (PEI), polyarylate (PAR), polybutylene telephthalate (PBT), polyimide and the like can be used as the plastic substrate. The card substrate 540 preferably has high thermal conductivity of approximately from 2 W/mK to 30 W/mK for radiating heat generated in the thin film integrated circuit or the display device.

In this embodiment, tungsten is used for the metal film 501, however, the metal film of the present invention is not limited to tungsten. Any material can be used as long as the material includes a metal that allows a substrate to be separated by forming the metal oxide film 503 over the surface of the material and crystallizing the metal oxide film 503. For example, TiN, WN, Mo and the like can be used. When an alloy of the elements is used as the metal film, the optimum temperature for a heat treatment in crystallization is different depending on the composition ratio thereof. Accordingly, a heat treatment can be performed at a temperature that is not interference in the step of manufacturing a semiconductor element by adjusting the composition ratio, and therefore, there are few limitations on choices for the process for a semiconductor element.

In laser crystallization, each thin film integrated circuit is formed in a region which fits within a width in a direction perpendicular to the scanning direction of a beam spot of a laser beam, thereby preventing the thin film integrated circuits from forming in regions having poor crystallinity (edges) at both ends of the longitudinal axis of the beam spot. According to this, a semiconductor film having few crystal grain boundaries can be used for a semiconductor element in the thin film integrated circuit.

According to the above-described method for manufacturing, an ultrathin film integrated circuit having a total thickness of from 1 μm through 5 μm, typically, about 2 μm can be formed. The thickness of a display device can be set to about 0.5 mm, preferably, about 0.3 mm. Accordingly, it is possible to mount the display device on an IC card having a thickness of from 0.05 mm through 1.5 mm. The thickness of the thin film integrated circuit includes a thickness of an insulating film provided between the metal oxide film and the semiconductor element, and a thickness of an interlayer insulating film covering the formed semiconductor element, in addition to the thickness of the semiconductor element itself.

The liquid crystal display device described in this embodiment is reflective type. As long as a backlight can be provided for the liquid display device, it may be a transmissive type. When the reflective liquid crystal display device is used, it is possible to reduce power consumption required for displaying an image more, as compared with a transmissive one. However, when the transmissive liquid crystal display device is used, an image can be seen more easily in the dark, as compared with the reflective one.

The display device of the present invention is required to have a resolution high enough that a person can be recognized with a photograph of the person's face. Therefore, for the sake of using the display device instead of an identification photograph, a resolution of at least QVGA (320×240) is required.

A semiconductor film, an insulating film or the like used in a display device is incused with a serial number. If a third person gets illegally an stolen IC card in which image data is not memorized in a ROM, it is possible to trace the distribution route by the serial number to some extent. In this case, it is efficient to incuse a serial number in a part in which the serial number can be deleted, only when the display device is tore down irreparably and cannot be repaired.

EMBODIMENT 2

Figure 14A:
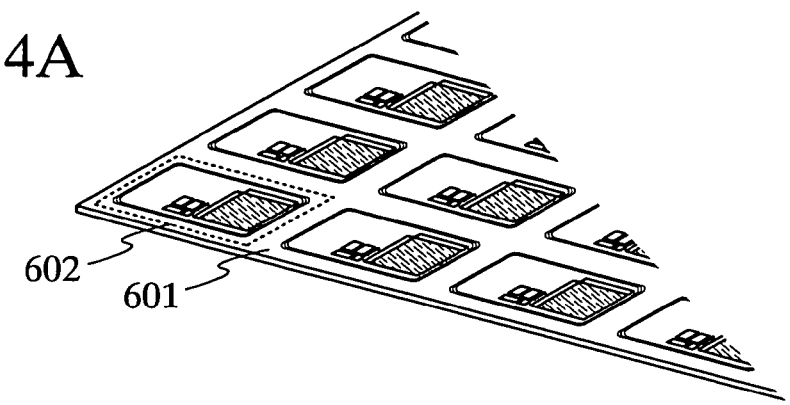
FIGS. 14A to 14D each show a method for manufacturing an IC card using a large card substrate, according to the present invention.

Next, an example of manufacturing a plurality of IC cards using a large-size substrate is described. FIG. 14A shows a state in which a display device, an antenna coil, and a thin film integrated circuit corresponding to a plurality of IC cards are formed over a large-size card substrate 601. FIG. 14A shows a state before a covering material is bonded by resin after a protective layer is removed. A region 602 surrounded by a dotted line corresponds to one IC card. In the case of using a liquid crystal display device as a display device, a liquid crystal may be injected by a dispenser method or a dip method. However, the dispenser method is employed when an injection port for a liquid crystal for the dip method cannot be arranged in an edge portion of a card substrate, as shown in FIG. 14A.

Figure 14B:
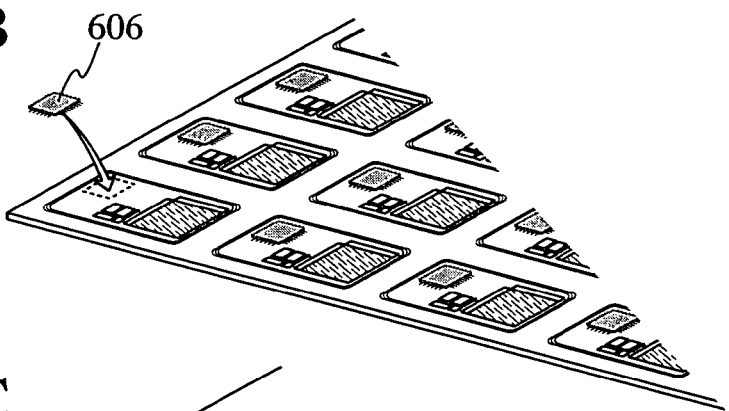

An IC chip 606 corresponding to each IC card is mounted, as shown in FIG. 14B.

Figure 14C:
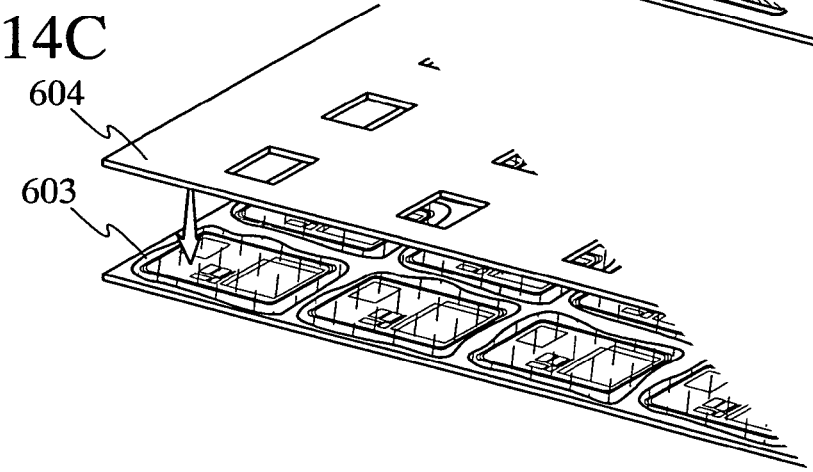

Resin 603 is applied to cover the IC chip 606, the thin film integrated circuit, the display device, and the antenna coil corresponding to each of IC cards, as shown in FIG. 14C. In FIG. 14B, regions to be applied with the light-transmitting resin 603 are each separated to correspond to each IC card. However, the resin may be applied to the whole area. When the resin 603 is less light-transmitting, the resin 603 is applied to a portion that is not overlapped with the display device.

Then, a covering material 604 is attached. The covering material 604 has an opening portion in a portion overlapping with the display device.

Figure 14D:
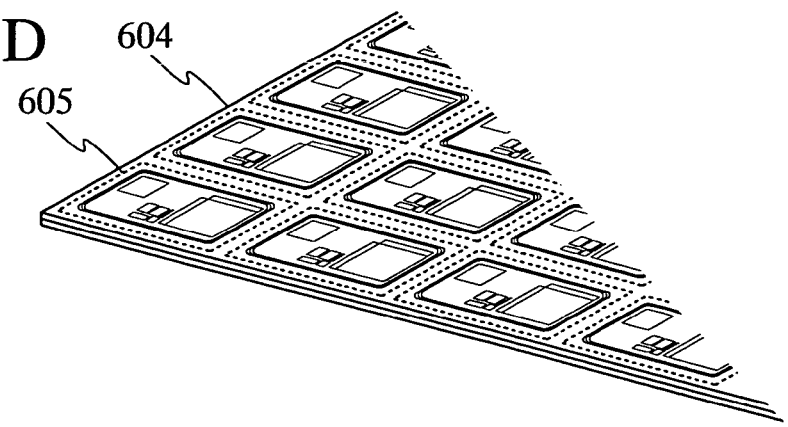

After the covering material 604 is attached, dicing is performed along a dotted line 605 to separate the IC cards from one another, as shown in FIG. 14D. The IC card may be complete at this stage, and also may be complete by sealing with a sealant thereafter. Note that dicing may be performed by using laser light.

EMBODIMENT 3

A liquid crystal material suitable for the case where a liquid crystal display device is used as a display device and the case where a display element is transferred after completed, is described in this embodiment.

FIGS. 15A and 15B are cross sectional views of a liquid crystal display device of this embodiment. A columnar spacer 1401 is provided for a pixel in a liquid crystal display device shown in FIG. 15A. The adhesion between an opposite substrate 1402 and a substrate 1403 on the side of elements is enhanced by the columnar spacer 1401. This makes it possible to prevent a semiconductor element in the outside of the area overlapping with a sealing material from remaining on the side of the first substrate, when the first substrate is separated.

FIG. 15B is a cross sectional view of a liquid crystal display device using a nematic liquid crystal, a smectic liquid crystal, a ferroelectric liquid crystal, or a PDLC (polymer dispersed liquid crystal) containing these liquid crystals in polymer resin. The adhesion between the opposite substrate 1402 and the substrate 1403 on the side of elements is enhanced by using the PDLC 1404. This makes it possible to prevent a semiconductor element in the outside of the area overlapping with a sealing material from remaining on the side of the first substrate, when the first substrate is separated.

Note that a liquid crystal used for the liquid crystal display device of the present invention is not limited to the material that is shown in this embodiment. For example, a PSFLC (a polymer stabilized ferroelectric liquid crystal) may be employed. In this case, after a monomer for forming a PSFLC is injected, the monomer is polymerized by ultraviolet ray irradiation, thereby forming the PSFLC. Since the PSFLC can enhance the adhesion between the opposite substrate and the substrate on the side of elements, it can prevent a semiconductor element in the outside of the area overlapping with a sealing material from remaining on the side of the first substrate, when the first substrate is separated.

EMBODIMENT 4

In this embodiment, a structure of a light-emitting device mounted on the IC card of the present invention is described.

Figure 16:
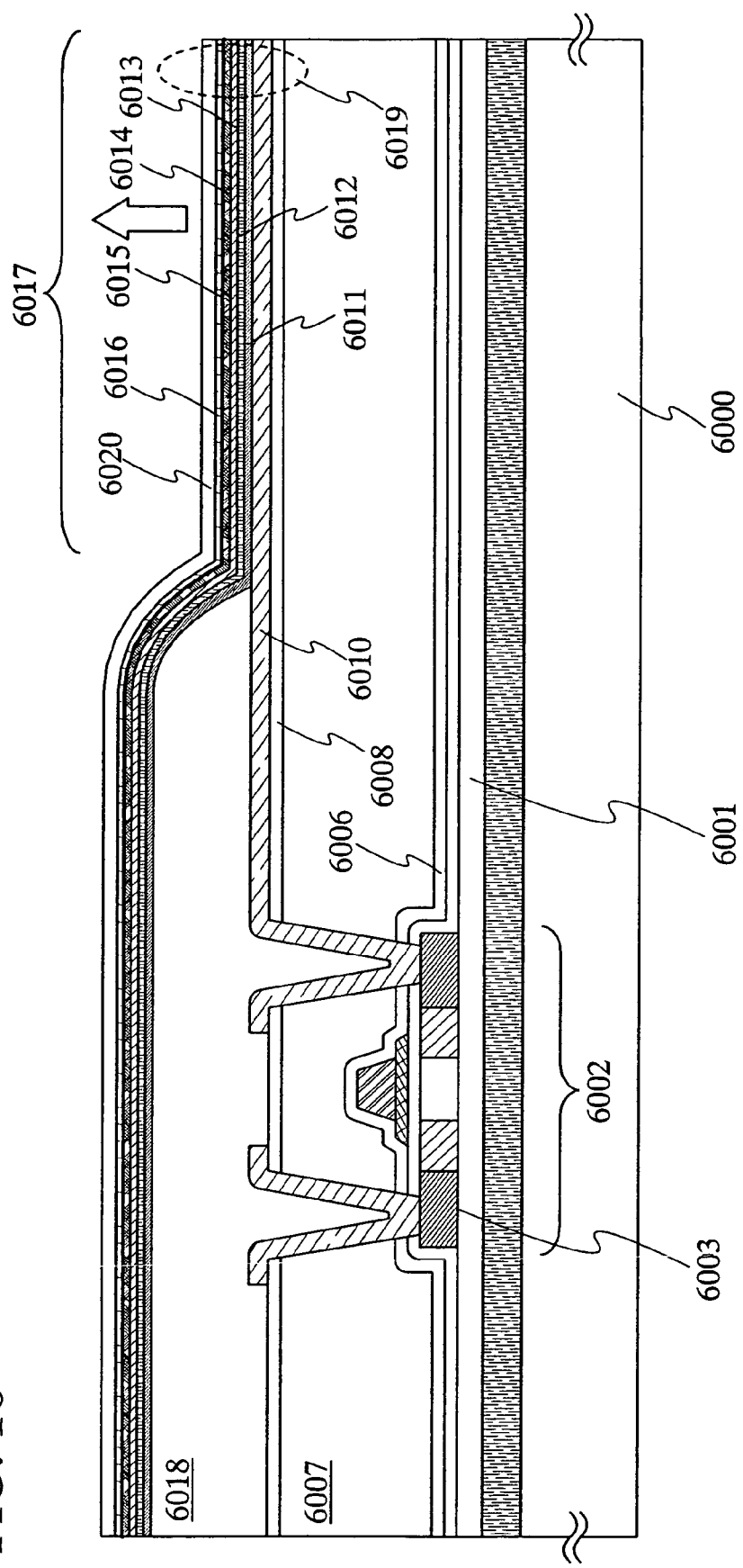
FIG. 16 is a cross-sectional view of a light-emitting device.

In FIG. 16, a base film 6001 is formed over a card substrate 6000. A transistor 6002 is formed on the base film 6001. The transistor 6002 is covered with a first interlayer insulating film 6006. A second interlayer insulating film 6007 and a third interlayer insulating film 6008 are laminated over the first interlayer insulating film 6006.

The first interlayer insulating film 6006 is formed by depositing a silicon oxide film, a silicon nitride film, or a silicon oxynitride film in a single layer or a laminate by a plasma CVD method or a sputtering method. An oxynitride film in which mole fraction of oxygen is higher than that of nitrogen is laminated over an oxynitride film in which mole fraction of nitrogen is higher than that of oxygen to form a film. The film may be used as the first interlayer insulating film 6006.

A heat treatment (for 1 to 12 hours at temperatures from 300° C. to 550° C.) is performed after the first interlayer insulating film 6006 is formed. As a result, a dangling bond of a semiconductor contained in an active layer 6003 can be terminated (hydrogenated) by hydrogen contained in the first interlayer insulating film 6006.

An organic resin film, an inorganic insulating film, an insulating film including Si—O bond and Si—CHx bond that are formed by using a siloxane material as a start material, or the like can be used as the second interlayer insulating film 6007. A nonphotosensitive acrylic resin is used in this embodiment. A film that prevents more a material such as moisture or oxygen that is a cause of deterioration of a light emitting element from penetrating than other insulating films is used for a third interlayer insulating film 6008. Typically, a DLC (diamond like carbon) film, a carbon nitride film, a silicon nitride film formed by a RF sputtering method, or the like is preferably used.

CuPc of 20 nm thick as a hole injection layer 6011, α-NPD of 40 nm thick as a hole transporting layer 6012, $Alq_3$ of 37.5 nm thick added with DMQd as a light emitting layer 6013, $Alq_3$ of 37.5 nm thick as an electron transporting layer 6014, $CaF_2$ of 1 nm thick as an electron injection layer 6015, and Al of from 10 nm to 30 nm thick as a cathode 6016 are laminated sequentially over an anode 6010 formed from TiN to form a light-emitting element 6019. In FIG. 16, a material that cannot transmit light is used for the anode 6010, and the cathode 6016 has a thickness of from 10 nm to 30 nm to transmit light, thereby obtaining light emitted from the light emitting element 6019 from the side of the cathode 6016. An ITO having a small work function due to addition of Li may be used so that the light can be emitted from the side of the cathode 6016, in addition to the method for making a film thickness smaller.

The transistor 6002 is a driving transistor for controlling a current supplied to the light emitting element 6019, and is connected to the light emitting element 6019 in series directly or via another circuit element.

The anode 6010 is formed on the third interlayer insulating film 6008. A barrier film 6018 is formed over the third interlayer insulating film 6008. An organic resin film, an inorganic insulating film, an insulating film including Si—O bond and Si—CHx bond formed by using a siloxane material as a start or the like can be used for the barrier film 6018. The barrier film 6018 has an opening portion 6017 and a light emitting element 6019 is formed by laminating the anode 6010, the hole injection layer 6011, the hole transporting layer 6012, the light emitting layer 6013, the electron transporting layer 6014, the electron injection layer 6015 and the cathode 6016 in the opening portion.

A protective film 6020 is formed over the cathode 6016. As well as the third interlayer insulating film 6008, a film that prevents more a material promoting a deterioration of the light emitting element such as moisture and oxygen from penetrating than other insulating films is used as the protective film 6020. Typically, for example, a DLC film, a carbon nitride film, a silicon nitride film formed by the RF sputtering method or the like is preferably used. A laminate of the above-described film through which the material such as moisture and oxygen is not transmitted easily and a film through which the material such as moisture and oxygen is transmitted easily can be used as the protective film.

An end portion of the barrier film 6018 in the opening portion 6017 is preferably allowed to have a round shape so that the hole injection layer 6011, the hole transporting layer 6012, the light emitting layer 6013, the electron transporting layer 6014, the electron injection layer 6015 do not have holes in the end portion thereof. Specifically, the curvature radius of the curve line shown by the sectional face of the organic resin film in the opening portion is preferably about from 0.2 μm to 2 μm.

With the above structure, the coverage of the hole injection layer 6011, the hole transporting layer 6012, the light emitting layer 6013, the electron transporting layer 6014, and the electron injection layer 6015, and the cathode 6016 that are formed later can be enhanced. Thus, it can be prevented that the anode 6010 and the cathode 6016 may short-circuit. Moreover, by relieving the stress of each of the above-described layers, a defect that a light emitting region decreases, which is referred to as a shrinkage, can be reduced and the reliability can be thus enhanced.

Practically, when the device shown in FIG. 16 is completed, a protective film (a laminate film, an ultraviolet curing resin or the like) having a favorable airtightness and less degasfication or a light-transmitting substrate for sealing is preferably used to package (seal) the device and not to expose the device to air. At the time, resin is filled therein to enhance the adhesion of the substrate for sealing for the sake of preventing the substrate for sealing from peeling off in the step of separating a second substrate.

FIG. 16 shows a light-emitting device before a covering material is bonded. In this embodiment, light emitted from the light-emitting element 6019 is emitted toward the side of the covering material, as the arrow shows. However, the present invention is not limited thereto. The light emitted from the light-emitting element may be emitted toward the side of the card substrate. In this case, an image displayed in a pixel portion is seen from the side of the card substrate.

The light emitting device used in an IC card of the present invention is not limited to the structure shown in FIG. 16.

EMBODIMENT 5

Figure 17:
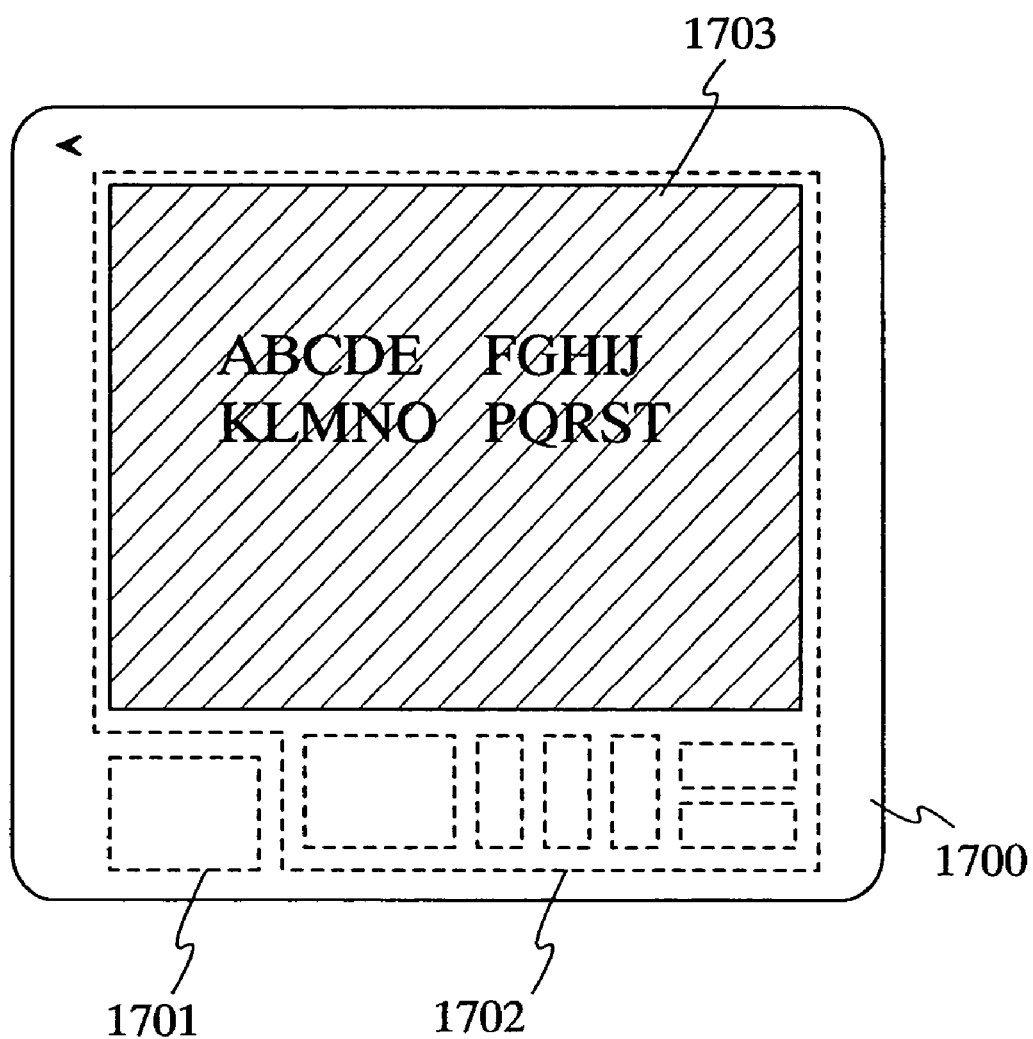
FIG. 17 shows an application mode of an IC card of the present invention.

A configuration of an IC card of the present invention having a function as an electronic book is described in this embodiment. FIG. 17 shows a top view of an IC card of this embodiment. In the IC card shown in FIG. 17, reference numeral 1700 denotes a card body that incorporates an IC chip 1701 and a thin film integrated circuit 1702. The thin film integrated circuit 1702 includes a display device and information such as characters that is input from the external of the IC card can be displayed by a display portion 1703 of the display device.

Note that the IC card shown in FIG. 17 may be a contact type IC card although it is a noncontact type IC card. In the case of a contact type one, the size of an IC card is determined depending on a standard of a terminal device provided with a reader/writer. On the other hand, a noncontact type one does not necessarily follow a standard of a terminal device.

Text data such as characters has less information than images, and thus, power consumption in a noncontact type IC card can be suppressed by sending and receiving data. Further, the text data such as characters can be displayed as a still image, and thus power consumption for displaying it can be suppressed.

This application is based on Japanese Patent Application serial no. 2003-305805 filed in Japan Patent Office on 29 Aug. 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A card comprising:
   a plastic substrate;
   a first single crystal integrated circuit mounted over the plastic substrate;
   a second integrated circuit mounted over the plastic substrate;
   a display device mounted over the plastic substrate; and
   a covering material over the first single crystal integrated circuit and the second integrated circuit,
   wherein the second integrated circuit and the display device each comprise a semiconductor element;
   wherein the semiconductor element comprises a polycrystalline semiconductor film;
   wherein the polycrystalline semiconductor film is used as a channel formation region of the semiconductor element;
   wherein the display device is an active matrix type;
   wherein the first single crystal integrated circuit comprises an analog circuit and a radio frequency circuit, and the second integrated circuit comprises a digital circuit;
   wherein the semiconductor element is formed over an oxide film;
   wherein the oxide film is bonded to the plastic substrate with an adhesive agent;
   wherein the first single crystal integrated circuit is electrically connected to the second integrated circuit; and
   wherein the covering material has an opening portion which is overlapped with the display device.

2. The card according to claim 1, wherein the display device is a liquid crystal display device.

3. The card according to claim 1, wherein the display device is a light emitting device.

4. The card according to claim 1, wherein the first single crystal integrated circuit is mounted over the plastic substrate by a chip on glass method.

5. The card according to claim 1, wherein a thickness of the second integrated circuit is 1 μm or more and 5 μm or less.

6. The card according to claim 1, wherein a thickness of the card is 0.5 mm or more and 1.5 mm or less.

7. The card according to claim 1,
   wherein the first single crystal integrated circuit is packed, and wherein a mode of packaging is selected from the group consisting of Chip Size Package, Multi Chip Package, Dual In-line Package, Quad Flat Package, and Small Outline Package.

8. The card according to claim 1, wherein the oxide film is a silicon oxide film.

9. The card according to claim 1, wherein the oxide film is from 150 to 300 nm in a thickness.

10. The card according to claim 1, wherein the adhesive agent is one selected from the group consisting of a reaction-curing adhesive agent, a thermal-curing adhesive agent, a photo-curing adhesive agent such as a UV curing adhesive agent, and an anaerobic adhesive agent.

11. The card according to claim 1, wherein the first single crystal integrated circuit is electrically connected with an antenna coil.

12. A card comprising:
a plastic substrate;
a first single crystal integrated circuit mounted over the plastic substrate;
a second integrated circuit mounted over the plastic substrate;
a display device mounted over the plastic substrate; and
a covering material over the first single crystal integrated circuit and the second integrated circuit,
wherein the second integrated circuit and the display device each comprise a semiconductor element;
wherein the semiconductor element comprises a polycrystalline semiconductor film;
wherein the polycrystalline semiconductor film is used as a channel formation region of the semiconductor element;
wherein the display device is an active matrix type;
wherein the first single crystal integrated circuit comprises an analog circuit and a radio frequency circuit, and the second integrated circuit comprises a digital circuit;
wherein the first single crystal integrated circuit is electrically connected to the second integrated circuit;
wherein the semiconductor element is formed over an oxide film;
wherein the oxide film is bonded to the plastic substrate with an adhesive agent;
wherein the first single crystal integrated circuit includes an interface; and
wherein the covering material has an opening portion which is overlapped with the display device.

13. The card according to claim 12 wherein the display device is a liquid crystal display device.

14. The card according to claim 12, wherein the display device is a light emitting device.

15. The card according to claim 12, wherein the first single crystal integrated circuit is mounted over the plastic substrate by a chip on glass method.

16. The card according to claim 12, wherein a thickness of the second integrated circuit is 1 μm or more and 5 μm or less.

17. The card according to claim 12, wherein a thickness of the card is 0.5 mm or more and 1.5 mm or less.

18. The card according to claim 12,
wherein the first single crystal integrated circuit is packed, and
wherein a mode of packaging is selected from the group consisting of Chip Size Package, Multi Chip Package, Dual In-line Package, Quad Flat Package, and Small Outline Package.

19. The card according to claim claim 12, wherein the oxide film is a silicon oxide film.

20. The card according to claim claim 12, wherein the oxide film is from 150 to 300 nm in a thickness.

21. The card according to claim claim 12, wherein the adhesive agent is one selected from the group consisting of a reaction-curing adhesive agent, a thermal-curing adhesive agent, a photo-curing adhesive agent such as a UV curing adhesive agent, and an anaerobic adhesive agent.

22. The card according to claim claim 12, wherein the first single crystal integrated circuit is electrically connected with an antenna coil.

23. A card comprising:
a plastic substrate;
a first single crystal integrated circuit mounted over the plastic substrate;
a second integrated circuit mounted over the plastic substrate;
a display device mounted over the plastic substrate; and
a covering material over the first single crystal integrated circuit and the second integrated circuit,
wherein the second integrated circuit and the display device each comprise a semiconductor element;
wherein the semiconductor element comprises a polycrystalline semiconductor film;
wherein the polycrystalline semiconductor film is used as a channel formation region of the semiconductor element;
wherein the display device is an active matrix type;
wherein the first single crystal integrated circuit comprises an analog circuit and a radio frequency circuit, and the second integrated circuit comprises a digital circuit;
wherein the semiconductor element is formed over an oxide film;
wherein the oxide film is bonded to the plastic substrate with an adhesive agent;
wherein the first single crystal integrated circuit is electrically connected to the second integrated circuit;
wherein driving of the display device is controlled by the second integrated circuit; and
wherein the covering material has an opening portion which is overlapped with the display device.

24. The card according to claim 23, wherein the display device is a liquid crystal display device.

25. The card according to claim 23, wherein the display device is a light emitting device.

26. The card according to claim 23, wherein the first single crystal integrated circuit is mounted over the plastic substrate by a chip on glass method.

27. The card according to claim 23, wherein a thickness of the second integrated circuit is 1 μm or more and 5 μm or less.

28. The card according to claim 23, wherein a thickness of the card is 0.5 mm or more and 1.5 mm or less.

29. The card according to claim 23,
wherein the first single crystal integrated circuit is packed, and
wherein a mode of packaging is selected from the group consisting of Chip Size Package, Multi Chip Package, Dual In-line Package, Quad Flat Package, and Small Outline Package.

30. The card according to claim claim 23, wherein the oxide film is a silicon oxide film.

31. The card according to claim claim 23, wherein the oxide film is from 150 to 300 nm in a thickness.

32. The card according to claim claim 23, wherein the adhesive agent is one selected from the group consisting of a reaction-curing adhesive agent, a thermal-curing adhesive agent, a photo-curing adhesive agent such as a UV curing adhesive agent, and an anaerobic adhesive agent.

33. The card according to claim claim 23, wherein the first single crystal integrated circuit is electrically connected with an antenna coil.

34. A card comprising:
a plastic substrate;
a first single crystal integrated circuit mounted over the plastic substrate;
a second integrated circuit mounted over the plastic substrate;
a display device mounted over the plastic substrate; and
a covering material over the first single crystal integrated circuit and the second integrated circuit,
wherein the second integrated circuit and the display device each comprise a semiconductor element;
wherein the display device is an active matrix type;
wherein the first single crystal integrated circuit comprises an analog circuit and a radio frequency circuit, and the second integrated circuit comprises a digital circuit;
wherein the semiconductor element comprises a polycrystalline semiconductor film;
wherein the polycrystalline semiconductor film is used as a channel formation region of the semiconductor element;
wherein the semiconductor element is formed over an oxide film;
wherein the oxide film is bonded to the plastic substrate with an adhesive agent; wherein the first single crystal integrated circuit is electrically connected to the second integrated circuit;
wherein the first single crystal integrated circuit includes an interface;
wherein driving of the display device is controlled by the second integrated circuit; and
wherein the covering material has an opening portion which is overlapped with the display device.

35. The card according to claim 34, wherein the display device is a liquid crystal display device.

36. The card according to claim 34, wherein the display device is a light emitting device.

37. The card according to claim 34, wherein the first single crystal integrated circuit is mounted over the plastic substrate by a chip on glass method.

38. The card according to claim 34, wherein a thickness of the second integrated circuit is 1 µm or more and 5 µm or less.

39. The card according to claim 34, wherein a thickness of the card is 0.5 mm or more and 1.5 mm or less.

40. The card according to claim 34,
wherein the first single crystal integrated circuit is packed, and
wherein a mode of packaging is selected from the group consisting of Chip Size Package, Multi Chip Package, Dual In-line Pack age, Quad Flat Package, and Small Outline Package.

41. The card according to claim 34, wherein the oxide film is a silicon oxide film.

42. The card according to claim 34, wherein the oxide film is from 150 to 300 nm in a thickness.

43. The card according to claim 34, wherein the adhesive agent is one selected from the group consisting of a reaction-curing adhesive agent, a thermal-curing adhesive agent, a photo-curing adhesive agent such as a UV curing adhesive agent, and an anaerobic adhesive agent.

44. The card according to claim 34, wherein the first single crystal integrated circuit is electrically connected with an antenna coil.

45. A card comprising:
a plastic substrate;
a first single crystal integrated circuit mounted over a concave portion of the plastic substrate;
a display device mounted over the plastic substrate; and
a second integrated circuit mounted over the plastic substrate,
wherein the second integrated circuit comprises a semiconductor element;
wherein the semiconductor element comprises a polycrystalline semiconductor film;
wherein the polycrystalline semiconductor film is used as a channel formation region of the semiconductor element;
wherein the display device is an active matrix type;
wherein the first single crystal integrated circuit comprises an analog circuit and a radio frequency circuit, and the second integrated circuit comprises a digital circuit;
wherein the semiconductor element is formed over an oxide film;
wherein the oxide film is bonded to the plastic substrate with an adhesive agent; and
wherein the first single crystal integrated circuit is electrically connected to the second integrated circuit.

46. The card according to claim 45, wherein the first single crystal integrated circuit is mounted over the plastic substrate by a chip on glass method.

47. The card according to claim 45, wherein a thickness of the second integrated circuit is 1 µm or more and 5 µm or less.

48. The card according to claim 45, wherein a thickness of the card is 0.5 mm or more and 1.5 mm or less.

49. The card according to claim 45,
wherein the first single crystal integrated circuit is packed, and
wherein a mode of packaging is selected from the group consisting of Chip Size Package, Multi Chip Package, Dual In-line Pack age, Quad Flat Package, and Small Outline Package.

50. The card according to claim 45, wherein the oxide film is a silicon oxide film.

51. The card according to claim 45, wherein the oxide film is from 150 to 300 nm in a thickness.

52. The card according to claim 45, wherein the adhesive agent is one selected from the group consisting of a reaction-curing adhesive agent, a thermal-curing adhesive agent, a photo-curing adhesive agent such as a UV curing adhesive agent, and an anaerobic adhesive agent.

53. The card according to claim 45, wherein the first single crystal integrated circuit is electrically connected with an antenna coil.

* * * * *